United States Patent
Hayashi et al.

(10) Patent No.: US 10,424,721 B2
(45) Date of Patent: Sep. 24, 2019

(54) PIEZOELECTRIC ELEMENT, MULTILAYERED PIEZOELECTRIC ELEMENT, LIQUID DISCHARGE HEAD, LIQUID DISCHARGE APPARATUS, ULTRASONIC MOTOR, OPTICAL APPARATUS, AND ELECTRONIC APPARATUS

(71) Applicant: CANON KABUSHIKI KAISHA, Tokyo (JP)

(72) Inventors: Jumpei Hayashi, Yokohama (JP); Kenichi Takeda, Tokohama (JP); Shinya Koyama, Tokyo (JP); Kenichi Akashi, Kawasaki (JP); Tatsuo Furuta, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/098,169

(22) Filed: Apr. 13, 2016

(65) Prior Publication Data

US 2016/0233414 A1    Aug. 11, 2016

Related U.S. Application Data

(63) Continuation of application No. 14/130,671, filed as application No. PCT/JP2012/066837 on Jun. 26, 2012, now Pat. No. 9,425,380.

(30) Foreign Application Priority Data

Jul. 5, 2011 (JP) .................................. 2011-149361

(51) Int. Cl.
*H01L 41/09* (2006.01)
*C04B 35/626* (2006.01)
(Continued)

(52) U.S. Cl.
CPC ........ *H01L 41/083* (2013.01); *B41J 2/14201* (2013.01); *B41J 2/14233* (2013.01);
(Continued)

(58) Field of Classification Search
CPC .......................... H01L 41/1876; H01L 41/083
(Continued)

(56) References Cited

U.S. PATENT DOCUMENTS 2,305,669 A * 12/1942 Budiloff ................. C25D 11/00
                                                              205/318
4,755,493 A * 7/1988 Takeuchi .............. C04B 35/465
                                                              252/62.9 R
(Continued)

FOREIGN PATENT DOCUMENTS

EP    2328193    * 1/2011    ........... H01L 41/187
EP    2328193 A2    6/2011
(Continued)

OTHER PUBLICATIONS

Li, Wei et al., "Piezoelectric and Dielectric Properties of (Ba1-xCax)(Ti0.95Zr0.05)O3 Lead-Free Ceramics", J. Am. Ceram. Soc., 93 [10] 2942-2944 (2010).

*Primary Examiner* — Thomas M Dougherty
*Assistant Examiner* — Karen B Addison
(74) *Attorney, Agent, or Firm* — Canon U.S.A. Inc., IP Division

(57) ABSTRACT

A lead-free piezoelectric element that stably operates in a wide operating temperature range contains a lead-free piezoelectric material. The piezoelectric element includes a first electrode, a second electrode, and a piezoelectric material that includes a perovskite-type metal oxide represented by $(Ba_{1-x}Ca_x)_a(Ti_{1-y}Zr_y)O_3$ ($1.00 \leq a \leq 1.01$, $0.02 \leq x \leq 0.30$, $0.020 \leq y \leq 0.095$, and $y \leq x$) as a main component and manganese incorporated in the perovskite-type metal oxide. The (Continued)

manganese content relative to 100 parts by weight of the perovskite-type metal oxide is 0.02 parts by weight or more and 0.40 parts by weight or less on a metal basis.

37 Claims, 10 Drawing Sheets

(51) Int. Cl.

| | | |
|---|---|---|
| *C04B 35/634* | (2006.01) | |
| *H01L 41/083* | (2006.01) | |
| *H01L 41/187* | (2006.01) | |
| *H02N 2/16* | (2006.01) | |
| *H02N 2/10* | (2006.01) | |
| *C04B 35/49* | (2006.01) | |
| *B41J 2/14* | (2006.01) | |
| *C04B 35/468* | (2006.01) | |

(52) U.S. Cl.
CPC ......... *C04B 35/4682* (2013.01); *C04B 35/49* (2013.01); *C04B 35/6261* (2013.01); *C04B 35/62685* (2013.01); *C04B 35/63416* (2013.01); *H01L 41/09* (2013.01); *H01L 41/0973* (2013.01); *H01L 41/1871* (2013.01); *H02N 2/106* (2013.01); *H02N 2/163* (2013.01); *B41J 2202/03* (2013.01); *C04B 2235/3208* (2013.01); *C04B 2235/3215* (2013.01); *C04B 2235/3236* (2013.01); *C04B 2235/3244* (2013.01); *C04B 2235/3248* (2013.01); *C04B 2235/3262* (2013.01); *C04B 2235/40* (2013.01); *C04B 2235/449* (2013.01); *C04B 2235/652* (2013.01); *C04B 2235/6567* (2013.01); *C04B 2235/6582* (2013.01); *C04B 2235/6584* (2013.01); *C04B 2235/72* (2013.01); *C04B 2235/768* (2013.01); *C04B 2235/77* (2013.01); *C04B 2235/78* (2013.01); *C04B 2235/785* (2013.01); *C04B 2235/786* (2013.01); *C04B 2235/79* (2013.01); *C04B 2235/80* (2013.01); *C04B 2235/85* (2013.01)

(58) Field of Classification Search
USPC ............... 310/359, 357, 311, 365, 364, 363; 501/134
See application file for complete search history.

(56) References Cited

U.S. PATENT DOCUMENTS

| | | | | |
|---|---|---|---|---|
| 4,775,493 | A * | 10/1988 | Mori | ............... C08K 3/16 252/572 |
| 7,838,453 | B2 * | 11/2010 | Katayama | ............ C01G 33/006 252/62.9 PZ |
| 8,172,372 | B2 * | 5/2012 | Fujii | .................... B41J 2/14233 310/334 |
| 2010/0029464 | A1 * | 2/2010 | Shibasaki | ........... C04B 35/4682 501/139 |

FOREIGN PATENT DOCUMENTS

| | | |
|---|---|---|
| JP | H02311362 A | 12/1990 |
| JP | H04107591 A | 4/1992 |
| JP | H0652718 A | 2/1994 |
| JP | 2002373825 A | 12/2002 |
| JP | 2003010785 A | 1/2003 |
| JP | 2004-238251 A | 8/2004 |
| JP | 2005022890 A | 1/2005 |
| JP | 2005026351 A | 1/2005 |
| JP | 2006005222 A | 1/2006 |
| JP | 2007-273584 A | 10/2007 |
| JP | 2007331958 A | 12/2007 |
| JP | 2007336684 A | 12/2007 |
| JP | 2009173473 A | 8/2009 |
| JP | 2017-108149 A | 6/2017 |
| RU | 2305669 C1 | 9/2007 |

* cited by examiner

PIEZOELECTRIC ELEMENT, MULTILAYERED PIEZOELECTRIC ELEMENT, LIQUID DISCHARGE HEAD, LIQUID DISCHARGE APPARATUS, ULTRASONIC MOTOR, OPTICAL APPARATUS, AND ELECTRONIC APPARATUS

CROSS REFERENCE TO RELATED APPLICATIONS

This application is a Continuation of U.S. patent application Ser. No. 14/130,671 filed Jan. 2, 2014, and which is a National Stage entry of PCT/JP2012/066837, filed Jun. 26, 2012, which claims priority to Japanese Patent Application No. 2011-149361, filed Jul. 5, 2011, all of which are hereby incorporated by reference herein in their entireties.

TECHNICAL FIELD

The present invention generally relates to piezoelectric elements, multilayered piezoelectric elements, liquid discharge heads, liquid discharge apparatuses, ultrasonic motors, optical apparatuses, and electronic apparatuses. In particular, the present invention relates to a piezoelectric element, a multilayered piezoelectric element, a liquid discharge head, a liquid discharge apparatus, an ultrasonic motor, an optical apparatus, and an electronic apparatus that do not contain lead and operate stably in operating temperature ranges.

BACKGROUND ART

ABO$_3$ perovskite-type metal oxides such as lead zirconate titanate (referred to as "PZT" hereinafter) are typically used as piezoelectric materials. Since PZT contains lead as the A site element, a concern has been raised over PZT's impact on the environment. Thus, piezoelectric materials that use lead-free perovskite-type metal oxides are highly desirable.

An example of a lead-free piezoelectric material that contains a perovskite-type metal oxide is barium titanate. Studies on and development of barium-titanate-based materials been conducted to improve properties of barium titanate and devices that use such materials have been disclosed. PTL 1 discloses a piezoelectric element that uses barium titanate with the addition of Mn, Fe, or Cu and with some of the A sites being substituted with Ca. These piezoelectric elements have mechanical quality factors superior to those of barium titanate but have low piezoelectric properties. Thus, high voltage has been required to drive piezoelectric elements.

PTL 2 discloses an actuator and a liquid discharge head that use a material prepared by adding Ba and B to barium titanate. This material has an advantage of low sintering temperature but has a piezoelectric constant d$_{33}$ as low as 65 [pC/N]. Thus, high voltage has been required to drive the piezoelectric element.

Piezoelectric materials having a Curie temperature of 80° C. or less may undergo depolarization in a severe environment such as car compartments under summer sun and may lose piezoelectricity as a result. Piezoelectricity may be lost by heat generated as a result of driving of actuators.

CITATION LIST

Patent Literature

PTL 1 Japanese Patent Laid-Open No. 2010-120835
PTL 2 Japanese Patent Laid-Open No. 2011-032111

SUMMARY OF INVENTION

Technical Problem

The invention provides a lead-free piezoelectric element that stably operates in a wide operating temperature range.

Solution to Problem

A first aspect of the invention provides a piezoelectric element that includes a first electrode, a second electrode, and a piezoelectric material. The piezoelectric material includes a perovskite-type metal oxide represented by general formula (1) as a main component, and manganese incorporated in the perovskite-type metal oxide:

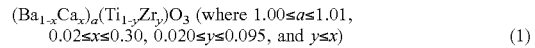

$(Ba_{1-x}Ca_x)_a(Ti_{1-y}Zr_y)O_3$ (where 1.00≤a≤1.01, 0.02≤x≤0.30, 0.020≤y≤0.095, and y≤x)  (1)

A manganese content relative to 100 parts by weight of the perovskite-type metal oxide is 0.02 parts by weight or more and 0.40 parts by weight or less on a metal basis.

A second aspect of the present invention provides a multilayered piezoelectric element that includes piezoelectric material layers and electrodes including an internal electrode. The piezoelectric material layers and the electrodes are alternately stacked. The piezoelectric material layers each contain a perovskite-type metal oxide represented by general formula (1) as a main component, and manganese incorporated in the perovskite-type metal oxide:

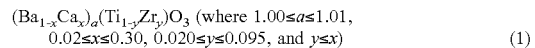

$(Ba_{1-x}Ca_x)_a(Ti_{1-y}Zr_y)O_3$ (where 1.00≤a≤1.01, 0.02≤x≤0.30, 0.020≤y≤0.095, and y≤x)  (1)

The manganese content relative to 100 parts by weight of the perovskite-type metal oxide is 0.02 parts by weight or more and 0.40 parts by weight or less on a metal basis.

A third aspect of the present invention provides a liquid discharge head that includes a liquid reservoir including a vibrating unit that includes the piezoelectric element or the multilayered piezoelectric element described above, and a discharge port in communication with the liquid reservoir. A fourth aspect of the present invention provides a liquid discharge apparatus that includes a transport unit configured to transport a recording medium and the liquid discharge head described above.

A fifth aspect of the present invention provides an ultrasonic motor that includes a vibrating member including the piezoelectric element or the multilayered piezoelectric described above and a moving member in contact with the vibrating member. A sixth aspect of the present invention provides an optical apparatus that includes a driving unit including the ultrasonic motor described above. A seventh aspect of the present invention provides an electronic apparatus that includes a piezoelectric acoustic component including the piezoelectric element or the multilayered piezoelectric element described above.

Advantageous Effects of Invention

A lead-free piezoelectric element that stably operates in a wide operating temperature range can be provided. A liquid discharge head, a liquid discharge apparatus, an ultrasonic motor, an optical apparatus, and an electronic apparatus that use this lead-free piezoelectric element can also be provided.

DESCRIPTION OF EMBODIMENTS

Embodiments of the invention will now be described.

Figure 1:
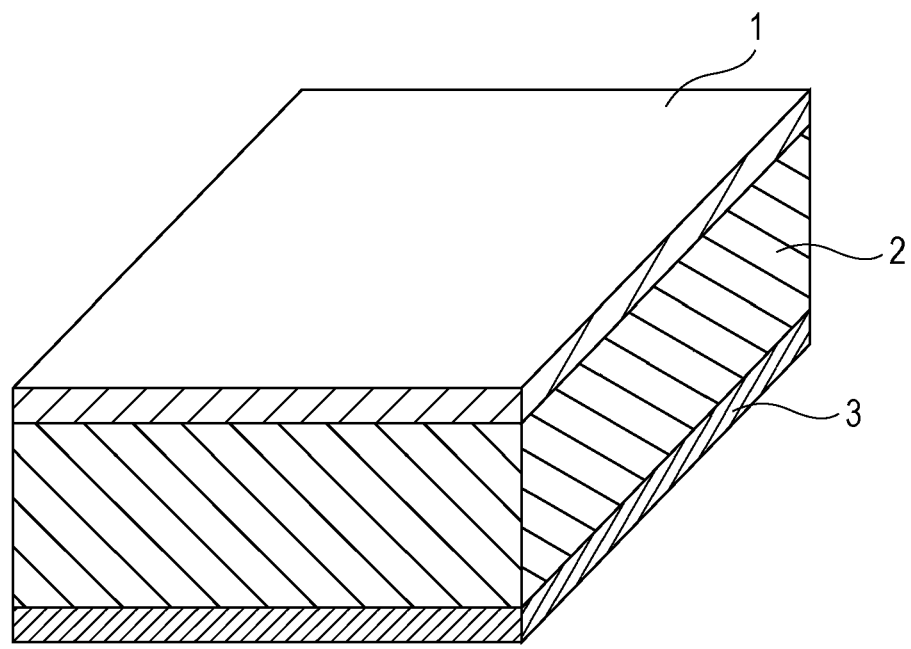
FIG. 1 is a schematic view showing a piezoelectric element according to an embodiment of the invention.

FIG. 1 is a schematic view showing a piezoelectric element according to one embodiment of the present invention. The piezoelectric element includes a piezoelectric material 2, and a first electrode 1 and a second electrode 3 associated with the piezoelectric material 2.

The piezoelectric element includes at least a first electrode, a piezoelectric material, and a second electrode. The piezoelectric material contains a perovskite-type metal oxide represented by general formula (1) as a main component and manganese (Mn) incorporated in the perovskite-type metal oxide:

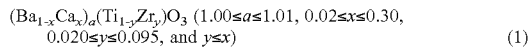

$(Ba_{1-x}Ca_x)_a(Ti_{1-y}Zr_y)O_3$ (1.00≤a≤1.01, 0.02≤x≤0.30, 0.020≤y≤0.095, and y≤x) (1)

The Mn content relative to 100 parts by weight of the metal oxide is 0.02 parts by weight or more and 0.40 parts by weight or less on a metal basis.

Each of the first and second electrodes is constituted by an electrically conductive layer having a thickness of about 5 nm to about 2000 nm. The material used to form the electrodes may be any material commonly used in piezoelectric elements. Examples thereof include metals such as Ti, Pt, Ta, Ir, Sr, In, Sn, Au, Al, Fe, Cr, Ni, Pd, Ag, and Cu and compounds thereof.

The first and second electrodes may each be composed of one of these materials or may each be constituted by a multilayered structure prepared by stacking two or more of these materials. The first and second electrodes may be composed of materials different from each other.

The method for making the first and second electrodes may be any. For example, the electrodes may be formed by baking a metal paste, by sputtering, or by vapor deposition. The first and second electrode may be patterned as desired.

In this description, a perovskite-type metal oxide refers to a metal oxide having a perovskite-type structure which is ideally a cubic crystal structure as described in Iwanami Rikagaku Jiten, 5th edition (published Feb. 20, 1998 by Iwanami Shoten Publishers). A metal oxide having a perovskite-type structure is usually expressed by a chemical formula, $ABO_3$. Element A and element B in a perovskite-type metal oxide take form of ions and occupy particular positions in a unit cell called A sites and B sites, respectively. For example, in a unit cell of a cubic crystal system, element A occupies vertexes of the cube and element B occupies the body-centered position of the cube. Element O is oxygen in the form of an anion and occupies face-centered positions of the cube.

In the metal oxide represented by general formula (1) above, barium (Ba) and calcium (Ca) are metal elements that occupy A sites and titanium (Ti) and zirconium (Zr) are metal elements that occupy B sites. Note that some of the Ba and Ca atoms may occupy B sites and/or some of the Ti and Zr atoms may occupy A sites.

In general formula (1), the molar ratio of the B-site element to O is 1:3. A metal oxide having a B-site element/O ratio slightly deviated therefrom, e.g., 1.00:2.94 to 1.00:3.06, is still included in the scope of the present invention as long as the metal oxide has a perovskite-type structure as a main phase.

Structural analysis through X-ray diffraction or electron beam diffraction can be used to determine whether a metal oxide has a perovskite-type structure, for example.

The piezoelectric material may take any form, for example, a ceramic, powder, single crystal, film, slurry, or the like but is preferably a ceramic. In this description, a "ceramic" refers to an aggregate (also referred to as bulk) of crystal grains basically composed of a metal oxide and consolidated by heat treatment, and is a polycrystal. A "ceramic" may also refer to a ceramic that has been processed after sintering.

In general formula (1) above, a represents the ratio of the total molar amount of Ba and Ca in A sites to the total molar amount of Ti and Zr in B sites and is in a range of 1.00≤a≤1.01. When a is smaller than 1.00, abnormal grain growth readily occurs and the mechanical strength of the material is decreased. When a is greater than 1.01, the temperature needed for grain growth becomes excessively high and sintering cannot be achieved in a common firing furnace. Here, "sintering cannot be achieved" refers to a state in which the density is not sufficiently increased or a large number of pores and defects are present in the piezoelectric material.

In general formula (1), x represents the molar ratio of Ca in A sites and is in a range of 0.02≤x≤0.30. When x is less than 0.02, the dielectric loss (tan δ) increases. When the dielectric loss is increased, the amount of heat generated when a voltage is applied to the piezoelectric element to drive the piezoelectric element increases and the drive efficiency may be degraded. When x is greater than 0.30, the piezoelectric property may not be sufficient.

In general formula (1), y represents the molar ratio of Zr in B sites and is in a range of 0.020≤y≤0.095. When y is less than 0.020, the piezoelectric property may not be sufficient. When y is greater than 0.095, the Curie temperature ($T_c$) becomes less than 85° C. and the piezoelectric property will be lost at high temperature.

In this description, a Curie temperature refers to a temperature at which ferroelectricity is lost. Examples of the method for detecting the temperature include a method of directly measuring the temperature at which ferroelectricity is lost by varying the measurement temperature and a method of measuring the dielectric constant using minute AC fields while varying the measurement temperature and determining the temperature at which the dielectric constant is maximal.

In general formula (1), the Ca molar ratio x and the Zr molar ratio y satisfy y≤x. When y>x, the dielectric loss may increase and the insulating property may be insufficient. When all of the ranges concerning x and y described heretofore are satisfied simultaneously, the crystal structure phase transition temperature (phase transition point) can be shifted from near room temperature to a temperature below the operating temperature range and thus the device can be stably driven in a wide temperature range.

The method for determining the composition of the piezoelectric material used in the piezoelectric element is not particularly limited. Examples of the method include X-ray fluorescence analysis, inductively coupled plasma (ICP) atomic emission spectroscopy, and atomic absorption spectrometry. The weight ratios and compositional ratios of the elements contained in the piezoelectric material can be determined by any of these methods.

The piezoelectric material used in the piezoelectric element has a Mn content of 0.02 parts by weight or more and 0.40 parts by weight or less on a metal basis relative to 100 parts by weight of the metal oxide. The piezoelectric material having a Mn content within this range exhibits an improved insulation property and an improved mechanical quality factor. Here, the mechanical quality factor refers to a factor that indicates an elastic loss caused by oscillation when the piezoelectric material is used in an oscillator. The magnitude of the mechanical quality factor is observed as a sharpness of a resonance curve in impedance measurement. In other words, the mechanical quality factor is a factor that indicates the sharpness of the resonance of an oscillator. Presumably, the insulating property and the mechanical quality factor are improved by introduction of defect dipoles due to Mn having a valence different from that of Ti and Zr and generation of internal electric fields resulting therefrom. When an internal electric field is present, a piezoelectric element formed by using the piezoelectric material and operated by applying voltage exhibits long-term reliability.

The term "on a metal basis" with reference to the Mn content refers to a value determined by first determining the oxide-based amounts of elements constituting the metal oxide represented by general formula (1) based on the Ba, Ca, Ti, Zr, and Mn contents measured by XRF, ICP atomic emission spectroscopy, atomic absorption spectroscopy, or the like and then calculating the ratio of the weight of Mn relative to 100 parts by weight of the total amount of the elements constituting the metal oxide on a weight basis.

When the Mn content is less than 0.02 parts by weight, the effect of the polarization treatment is not sufficient to drive the device. When the Mn content is greater than 0.40 parts by weight, the piezoelectric property is not sufficient and crystals having a hexagonal structure not contributing to the piezoelectric property emerge.

Manganese is not limited to metallic Mn and may take any form as long as manganese is contained as a component in the piezoelectric material. For example, manganese may be dissolved in B sites or may be included in grain boundaries. Manganese may take the form of a metal, ion, oxide, metal salt, or complex in the piezoelectric material. Preferably, manganese is dissolved in B sites from the viewpoints of insulating property and sinterability. When manganese is dissolved in B sites, a preferable range of the molar ratio A/B for resonator devices (hard devices), such as piezoelectric sensors, piezoelectric transformers, and ultrasonic motors, that operate at resonance frequencies is $0.993 \leq A/B \leq 0.998$, where A is the molar amount of Ba and Ca in A sites and B is the molar amount of Ti, Zr, and Mn in B sites. A piezoelectric element having an A/B within this range exhibits a high piezoelectric constant and a high mechanical quality factor and thus forms a device having superior durability. A preferable range of A/B for displacement actuators (soft devices) such as optical pickup actuators and liquid discharge heads operating at non-resonant frequencies is $0.996 \leq A/B \leq 0.999$. Piezoelectric elements having an A/B within these ranges can exhibit a high piezoelectric constant, a low dielectric loss, and high durability.

The piezoelectric material used in the piezoelectric element may contain components (hereinafter referred to as auxiliary components) other than the compound represented by general formula (1) and Mn as long as the properties are not changed. The total content of the auxiliary components may be 1.2 parts by weight or less relative to 100 parts by weight of the metal oxide represented by general formula (1). When the auxiliary component content exceeds 1.2 parts by weight, the piezoelectric property and the insulating property of the piezoelectric material may be degraded. The content of the metal elements other than Ba, Ca, Ti, Zr, and Mn among the auxiliary components is preferably 1.0 parts by weight or less on an oxide basis or 0.9 parts by weight or less on a metal basis relative to the piezoelectric material. In this description, "metal elements" include semimetal elements such as Si, Ge, and Sb.

When the content of the metal elements other than Ba, Ca, Ti, Zr, and Mn among the auxiliary components exceeds 1.0 parts by weight on an oxide basis or 0.9 parts by weight on a metal basis relative to the piezoelectric material, the piezoelectric property and the insulating property of the piezoelectric material may be significantly degraded. The total content of Li, Na, Mg, and Al among the auxiliary components may be 0.5 parts by weight or less on a metal basis relative to the piezoelectric material. When the total content of Li, Na, Mg, and Al among the auxiliary components exceeds 0.5 parts by weight on a metal basis relative to the piezoelectric material, insufficient sintering may occur. The total of Y and V among the auxiliary components may be 0.2 parts by weight or less on a metal basis relative to the piezoelectric material. When the total content of Y and V exceeds 0.2 parts by weight on a metal basis relative to the piezoelectric material, the polarization treatment may become difficult.

Examples of the auxiliary components include sintering aids such as Si and Cu. Commercially available Ba and Ca raw materials contain Sr as an unavoidable impurity and thus the piezoelectric material may contain an impurity amount of Sr. Similarly, a commercially available Ti raw material contains Nb as an unavoidable impurity and a commercially available Zr raw material contains Hf as an unavoidable impurity. Thus, the piezoelectric material may contain impurity amounts of Nb and Hf.

The method for measuring the weights of the auxiliary components is not particularly limited. Examples of the method include X-ray fluorescence analysis, ICP atomic emission spectroscopy, and atomic absorption spectrometry.

The piezoelectric material used in the piezoelectric element may be constituted by crystal grains having an average circular equivalent diameter of 1 μm or more and 10 μm or less. When the average circular equivalent diameter is within this range, the piezoelectric material can exhibit good piezoelectric property and mechanical strength. When the average circular equivalent diameter is less than 1 μm, the piezoelectric property may be insufficient. When the average circular equivalent diameter is more than 10 μm, the mechanical strength may be degraded. A more preferable range is 3 μm or more and 8 μm or less.

In this description, a "circular equivalent diameter" refers to what is generally known as a "projected area diameter" in microscopy and indicates the diameter of a circle having the same area as the projected area of a crystal grain. In this invention, the method for measuring the circular equivalent diameter is not particularly limited. For example, an image of a surface of a piezoelectric material may be obtained with a polarizing microscope or a scanning electron microscope and the image may be processed to determine the circular equivalent diameter. Since the optimum magnification differs depending on the grain diameter to be analyzed, an optical microscope and an electron microscope may be properly used. The circular equivalent diameter may be determined from an image of a polished surface or a cross section instead of a surface of the material.

The relative density of the piezoelectric material used in the piezoelectric element may be 93% or more and 100% or less.

When the relative density is less than 93%, the piezoelectric property and/or mechanical quality factor may not be satisfactory and the mechanical strength may be degraded.

The main component of the piezoelectric material used in the piezoelectric element has x and y satisfying $0.125 \leq x \leq 0.175$ and $0.055 \leq y \leq 0.090$, respectively and the Mn content is 0.02 parts by weight or more and 0.10 parts by weight or less relative to 100 parts by weight of the metal oxide.

A piezoelectric element that uses a piezoelectric material within this compositional range is particularly suited for a displacement actuator (a.k.a., soft device) such as an optical pickup actuator or a liquid discharge head. When x indicating the molar ratio of Ca is less than 0.125, the durability may be degraded. When x is larger than 0.175, the piezoelectric strain constant may be decreased. Preferably, $0.140 \leq x \leq 0.175$. When y indicating the molar ratio of Zr is less than 0.055, the piezoelectric strain constant may be decreased. When y is greater than 0.09, the Curie temperature will decrease and thus the operating temperature range of the device may be narrowed. Preferably, $0.055 \leq y \leq 0.075$. When the Mn content is less than 0.02 parts by weight, the polarization treatment may not be conducted satisfactorily. At a Mn content greater than 0.10 parts by weight, the piezoelectric strain constant may be decreased. A preferable range for a is $1.000 \leq a \leq 1.005$.

The main component of the piezoelectric material used in the piezoelectric element preferably has x and y respectively satisfying $0.155 \leq x \leq 0.300$ and $0.041 \leq y \leq 0.069$. The Mn content is preferably 0.12 parts by weight or more and 0.40 parts by weight or less on a metal basis relative to 100 parts by weight of the main component metal oxide.

A piezoelectric element using the piezoelectric material within this compositional range is particularly suited for resonance devices (hard devices) such as piezoelectric sensors, piezoelectric transformers, and ultrasonic motors. When x indicating the molar ratio of Ca is less than 0.155, the mechanical quality factor may be decreased. When x is greater than 0.300, the piezoelectric strain constant may be degraded. Preferably, $0.160 \leq x \leq 0.300$. When y indicating the molar ratio of Zr is less than 0.041, the piezoelectric strain constant may be decreased. When y is greater than 0.069, the operating temperature range of the device may be narrowed. Preferably, $0.045 \leq y \leq 0.069$. When the Mn content is less than 0.12 parts by weight, the mechanical quality factor may be decreased and the power consumption during operation of the device at a resonant frequency may increase. When the Mn content is greater than 0.40 parts by weight, the piezoelectric strain constant may be decreased and a higher voltage may be needed to drive the device. Preferably, the Mn content is 0.20 parts by weight or more and 0.40 parts by weight or less. A preferable range for a is $1.004 \leq a \leq 1.009$.

A method for making the piezoelectric material used in the piezoelectric element is not particularly limited. In order to make a piezoelectric ceramic, solid powders such as oxides, carbonate salts, nitrate salts, oxalate salts, and the like containing elements constituting the ceramic may be sintered at a normal pressure, which is a typical process. The raw materials are metal compounds such as a Ba compound, a Ca compound, a Ti compound, a Zr compound, and a Mn compound.

Examples of the Ba compound that can be used include barium oxide, barium carbonate, barium oxalate, barium acetate, barium nitrate, barium titanate, barium zirconate, and barium zirconate titanate.

Examples of the Ca compound that can be used include calcium oxide, calcium carbonate, calcium oxalate, calcium acetate, calcium titanate, and calcium zirconate.

Examples of the Ti compound that can be used include titanium oxide, barium titanate, barium zirconate titanate, and calcium titanate.

Examples of the Zr compound that can be used include zirconium oxide, barium zirconate, barium zirconate titanate, and calcium zirconate.

Examples of the Mn compound that can be used include manganese carbonate, manganese oxide, manganese dioxide, manganese acetate, and trimanganese tetraoxide.

The raw materials for adjusting the molar ratio a, i.e., the molar amount of Ba and Ca in A sites to the molar amount of Ti and Zr in B sites of the piezoelectric ceramic used in the piezoelectric element are not particularly limited. The same effect can be achieved from a Ba compound, a Ca compound, a Ti compound, and a Zr compound.

The method for granulating raw material powders of the piezoelectric ceramic used in the piezoelectric element is not particularly limited. From the viewpoint of uniformity of particle diameter of the resulting powder, a spray dry method may be employed.

Examples of the binder used in granulation include polyvinyl alcohol (PVA), polyvinyl butyral (PVB), and acrylic resins. The amount of binder added is preferably 1 to 10 parts by weight and more preferably 2 to 5 parts by weight from the viewpoint of increasing the density of a compact.

The method for sintering the piezoelectric ceramic used in the piezoelectric element is not particularly limited. Sintering may be conducted with an electric furnace or a gas furnace or by an electric heating method, a microwave sintering method, a millimeter wave sintering method, or hot isostatic pressing (HIP). Sintering using an electric furnace or gas may be conducted in a continuous furnace or a batch furnace.

The sintering temperature of the ceramic in the sintering method described above is not particularly limited. The sintering temperature may be a temperature that allows the compounds to react and undergo sufficient crystal growth. The sintering temperature is preferably 1200° C. or more and 1550° C. or less and more preferably 13000 or more and 1480° C. or less from the viewpoint of making the grain diameter of the ceramic to be within the range of 1 μm to 10 μm. A piezoelectric ceramic sintered within this temperature range exhibits a good piezoelectric property.

In order to stabilize the properties of the piezoelectric ceramic obtained by sintering while achieving high reproducibility, the sintering temperature may be kept constant within the above described range and sintering may be conducted for 2 to 24 hours. A two-step sintering method may be employed but rapid temperature changes are not desirable from the viewpoint of productivity.

The piezoelectric ceramic may be heat-treated at a temperature of 1000° C. or higher after being polished. When a piezoelectric ceramic is mechanically polished, a residual stress occurs inside the piezoelectric ceramic. This residual stress can be relaxed by heat-treating at 1000° C. or higher and the piezoelectric property of the piezoelectric ceramic can be further improved. The heat treatment also has an effect of eliminating raw material powders, such as barium carbonate, precipitated in grain boundary portions. The amount of time for the heat treatment is not particularly limited but may be 1 hour or longer.

The piezoelectric element may have polarization axes oriented in a particular direction. When polarization axes are oriented in a particular direction, the piezoelectric constant of the piezoelectric element is increased. The polarization method for the piezoelectric element is not particularly limited. The polarization treatment may be conducted in air or in silicone oil. The temperature during polarization may be 60° C. to 100° C. but optimum conditions slightly vary depending on the composition of the piezoelectric ceramic constituting the device. The electric field applied to conduct the polarization treatment may be 800 V/mm to 2.0 kV/mm.

The piezoelectric constant and mechanical quality factor of the piezoelectric element can be calculated from a resonant frequency and an antiresonant frequency measured with a commercially available impedance analyzer on the basis of Electronic Materials Manufacturers Association of Japan Standard (EMAS-6100). This method is hereinafter referred to as a resonance-antiresonance method.

Multilayered Piezoelectric Element

Multilayered piezoelectric elements according to embodiments of the invention will now be described.

A multilayered piezoelectric element according to an embodiment is constituted by alternately stacking piezoelectric material layers and electrodes (including one or more inner electrodes). The piezoelectric material layers are each composed of a piezoelectric material that contains a perovskite-type metal oxide represented by general formula (1) below as a main component and manganese (Mn) incorporated in the perovskite-type metal oxide:

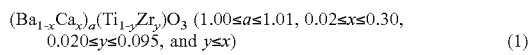

$(Ba_{1-x}Ca_x)_a(Ti_{1-y}Zr_y)O_3$ (1.00≤a≤1.01, 0.02≤x≤0.30, 0.020≤y≤0.095, and y≤x) (1)

The Mn content is 0.02 parts by weight or more and 0.40 parts by weight or less on a metal basis relative to 100 parts by weight of the metal oxide.

Figure 5A:
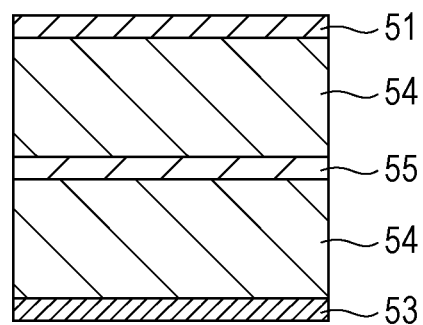
FIGS. 5A and 5B are each a cross-sectional view showing a multilayered piezoelectric element according to an embodiment of the invention.
Figure 5B:
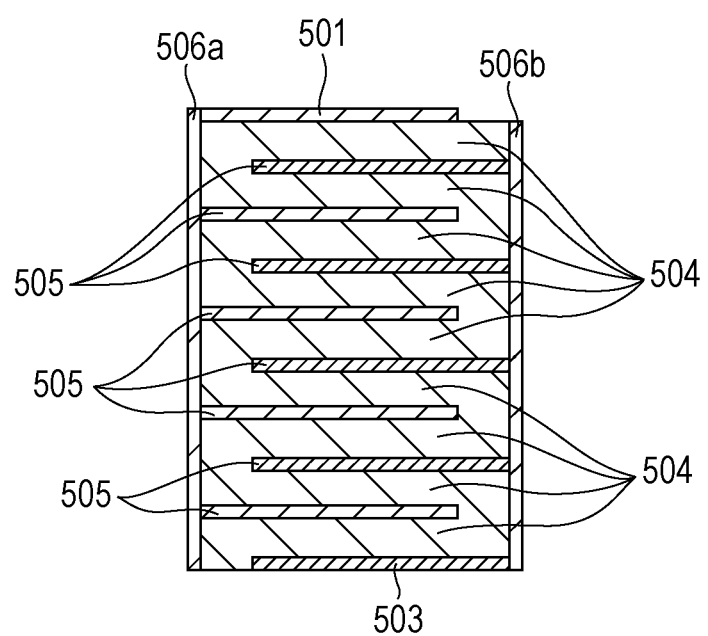

FIGS. 5A and 5B are each a cross-sectional view showing a structure of a multilayered piezoelectric element according to one embodiment. The multilayered piezoelectric element includes piezoelectric material layers and electrodes (including one or more inner electrodes) that are alternately stacked. The piezoelectric material layers are composed of the aforementioned piezoelectric material. The electrodes may include internal electrodes and external electrodes.

FIG. 5A shows a multilayered piezoelectric element according to an embodiment. The multilayered piezoelectric element includes two piezoelectric material layers 54 and one layer of an inner electrode 55 alternately stacked, and the resulting stack is sandwiched between a first electrode 51 and a second electrode 53. The number of layers of the piezoelectric material layers and the number of layers of inner electrodes may be increased as shown in FIG. 5B and are not particularly limited.

FIG. 5B shows a multilayered piezoelectric element according to another embodiment. The multilayered piezoelectric element includes nine layers of piezoelectric material layers 504 and eight layers of inner electrodes 505 that are alternately stacked, and the resulting stack is sandwiched between a first electrode 501 and a second electrode 503. An external electrode 506a and an external electrode 506b for short-circuiting the inner electrodes alternately stacked are disposed on side surfaces of the stack.

The inner electrodes 55 and 505 and external electrodes 506a and 506b may have a size and a shape different from those of the piezoelectric material layers 54 and 504 and may be divided into a plurality of segments.

Each of the inner electrodes 55 and 505 and the external electrodes 506a and 506b is constituted by a conductive layer having a thickness of about 5 nm to 2000 nm. The material therefor is not particularly limited and any material that is usually used in piezoelectric elements can be used. Examples of such a material include metals such as Ti, Pt, Ta, Ir, Sr, In, Sn, Au, Al, Fe, Cr, Ni, Pd, Ag, and Cu and compounds thereof. Each of the inner electrodes 55 and 505 and the external electrodes 506a and 506b may be composed of one of these materials or a mixture or an alloy of two or more of these materials, or may be constituted by a multilayered structure prepared by stacking two or more of these materials. The electrodes may be composed of materials different from each other. The inner electrodes 55 and 505 may be mainly composed of Ni since Ni is a low-cost electrode material.

As shown in FIG. 5B, the electrodes including the inner electrodes 505 may be short-circuited from each other to make driving voltage phases match. For example, the inner electrodes 505, the first electrode 501, and the second electrode 503 may be short-circuited in an alternating manner. The form of short-circuiting between the electrodes is not particularly limited. Electrodes and/or wires may be formed on side surfaces of a multilayered piezoelectric element to conduct short-circuiting, or through holes penetrating the piezoelectric material layers 504 may be formed and filled with a conductive material so as to short-circuit the electrodes.

The method for making a multilayered piezoelectric element is not particularly limited. One example is a method that includes a step (A) of preparing slurry by dispersing a metal compound powder containing at least Ba, Ca, Ti, Zr, and Mn, a step (B) of obtaining a compact by placing the slurry on a substrate, a step (C) of forming an electrode on the compact, and a step (D) of obtaining a multilayered piezoelectric element by sintering the compact on which the electrode has been formed.

In this specification, a "powder" refers to a group of solid particles. A powder may be a group of particles that each contain Ba, Ca, Ti, Zr, and Mn or a group of a plurality of types of particles containing different elements.

Examples of the metal compound powder used in the step (A) include a Ba compound, a Ca compound, a Ti compound, a Zr compound, and a Mn compound. Examples of the Ba compound that can be used include barium oxide, barium carbonate, barium oxalate, barium acetate, barium nitrate, barium titanate, barium zirconate, and barium zirconate titanate.

Examples of the Ca compound that can be used include calcium oxide, calcium carbonate, calcium oxalate, calcium acetate, calcium titanate, calcium zirconate, and calcium zirconate titanate.

Examples of the Ti compound that can be used include titanium oxide, barium titanate, barium zirconate titanate, and calcium titanate.

Examples of the Zr compound that can be used include zirconium oxide, barium zirconate, barium zirconate titanate, and calcium zirconate.

Examples of the Mn compound that can be used include manganese carbonate, manganese oxide, manganese dioxide, manganese acetate, and trimanganese tetraoxide.

An example of a method for preparing a slurry in the step (A) is as follows. To a metal compound powder, a solvent having a weight 1.6 to 1.7 greater than that of the metal compound powder is added, followed by mixing. Examples of the solvent that can be used include toluene, ethanol, a toluene-ethanol mixed solvent, n-butyl acetate, and water. The resulting mixture is mixed in a ball mill for 24 hours and a binder and a plasticizer are added thereto. Examples of the binder include polyvinyl alcohol (PVA), polyvinyl butyral (PVB), and acrylic resins. When PVB is used as the binder, the binder is weighed so that the solvent-to-PVB weight ratio is, for example, 88:12. Examples of the plasticizer include dioctyl sebacate, dioctyl phthalate, and dibutyl phthalate. When dibutyl phthalate is used as the plasticizer, dibutyl phthalate is weighed so that the weight thereof is the same as that of the binder. Then the resulting mixture is again mixed in a ball mill overnight. The amounts of the solvent and the binder are adjusted so that the viscosity of the slurry is 300 to 500 mPa·s.

The compact prepared in the step (B) is a sheet-shaped mixture of the metal compound powder, the binder, and the plasticizer. An example of a method for preparing the compact in the step (B) is a sheet-forming method. A doctor blade method may be employed in the sheet-forming method. A doctor blade method is a method that includes applying slurry to the substrate by using a doctor blade and drying the applied slurry to form a sheet-shaped compact. A polyethylene terephthalate (PET) film may be used as the substrate, for example. A surface of a PET film on which the slurry is to be placed may be coated with a fluorine coating in advance to facilitate separation of the compact. The slurry may be dried by air or hot air. The thickness of the compact is not particularly limited and can be adjusted according to the thickness of the multilayered piezoelectric element. The thickness of the compact can be increased by increasing the viscosity of the slurry, for example.

The method for making the electrodes, e.g., inner electrodes 505 and external electrodes 506a and 506b, in the step (C) is not particularly limited. The electrodes may be formed by firing a metal paste, or by a method such as sputtering, vapor deposition, or printing. The thickness and pitch of the piezoelectric material layers 504 may be decreased to decrease the driving voltage. In such a case, a process of forming a stack including precursors of the piezoelectric material layers 504 and inner electrodes 505 and then firing the resulting stack is selected. When this process is selected, the material of the inner electrodes 505 is desirably a material that does not undergo changes in shapes or deterioration of conductivity at a temperature needed to sinter the piezoelectric material layers 504. Metals, such as Ag, Pd, Au, Cu, and Ni, which have lower melting points and are less expensive than Pt, and alloys of such metals can be used to form electrodes such as inner electrodes 505 and the external electrodes 506a and 506b. Alternatively, the external electrodes 506a and 506b may be formed after the stack has been fired and, in such a case, may be composed of Al or a carbon-based electrode material in addition to Ag, Pd, Cu, or Ni.

The electrodes may be formed by a screen-printing method. A screen-printing method involves applying a metal paste onto a compact on a substrate through a screen plate by using a spatula. A screen mesh is formed in at least part of the screen plate. Thus, the metal paste is applied to the compact only in the portions where the screen mesh is formed. The screen mesh in the screen plate may have a pattern formed therein. The pattern is transferred to the compact by using the metal paste so as to form a patterned electrode on the compact.

After the electrode is formed in the step (C) and the compact with the electrode is separated from the substrate, one or a plurality of layers of the compacts are press-bonded. Examples of the press-bonding method include uniaxial pressing, cold isostatic pressing, and hot isostatic pressing. The press-bonding may be conducted by hot isostatic pressing since pressure can be evenly and isostatically applied to the compacts. Press bonding may be conducted under heating at a temperature near the glass transition temperature of the binder for satisfactory bonding. Two or more of the compacts may be stacked and press-bonded until a desired thickness is achieved. For example, 10 to 100 layers of compacts may be stacked and thermally press-bonded for 10 seconds to 10 minutes by applying a pressure of 10 to 60 MPa in the stacking direction at 50° C. to 80° C. to form a multilayered structure. Alignment marks may be attached to the electrodes so that a plurality of layers of compacts can be accurately aligned and stacked. Alternatively, accurate stacking may be conducted by forming through holes for alignment in the compacts.

Although the sintering temperature of the compact in the step (D) is not particularly limited, the sintering temperature may be a temperature at which compounds can react and sufficient crystal growth occurs. The sintering temperature is preferably 1200° C. or more and 1550° C. or less and more preferably 1300° C. or more and 1480° C. or less to adjust the grain diameter of the ceramic to be within a range of 1 μm to 10 μm. A multilayered piezoelectric element sintered within this temperature range exhibits a good piezoelectric property.

When a material mainly composed of Ni is used in the electrodes in the step (C), the step (D) may be conducted in a furnace capable of atmospheric firing. The binder is burned and removed at a temperature of 200° C. to 600° C. in an ambient atmosphere and then the compact is sintered at a temperature of 1200° C. to 1550° C. in a reducing atmosphere. A reducing atmosphere refers to an atmosphere mainly composed of a mixed gas of hydrogen ($H_2$) and nitrogen ($N_2$). The volume ratio of hydrogen to nitrogen may be $H_2:N_2=1:99$ to $10:90$. The mixed gas may contain oxygen. The oxygen concentration is $10^{-12}$ Pa or more and $10^{-4}$ Pa or less and preferably $10^{-8}$ Pa or more and $10^{-8}$ Pa or less. The oxygen concentration can be measured with a zirconia-type oxygen sensor. Since Ni electrodes are used, the multilayered piezoelectric element can be manufactured at a low cost. After firing in the reducing atmosphere, the compact may be cooled to 600° C. and the atmosphere may be changed to ambient atmosphere (oxidative atmosphere) to conduct an oxidation treatment. After the compact is discharged from the firing furnace, a conductive paste is applied to a side surface of the compact in which ends of the inner electrodes are exposed, and dried to form an external electrode.

Liquid Discharge Head

A liquid discharge head according to an embodiment of the present invention includes at least a discharge port in communication with a liquid reservoir equipped with a vibrating unit that includes a piezoelectric element or multilayered piezoelectric element.

Figure 2A:
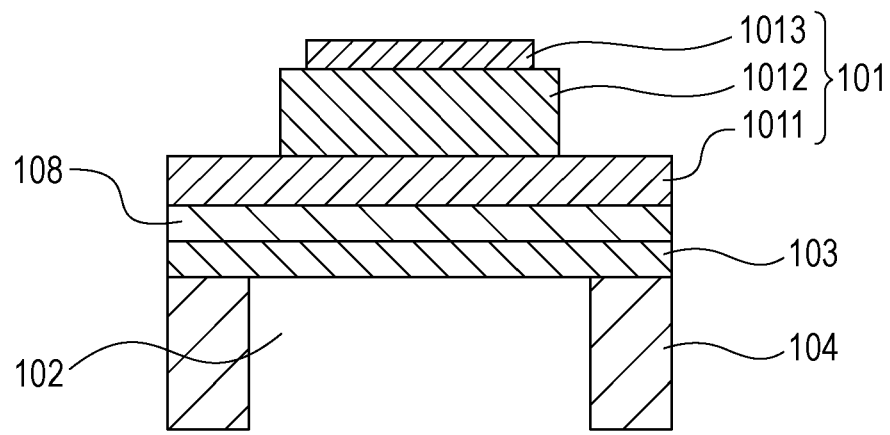
FIGS. 2A and 2B show a liquid discharge head according to an embodiment of the invention.
Figure 2B:
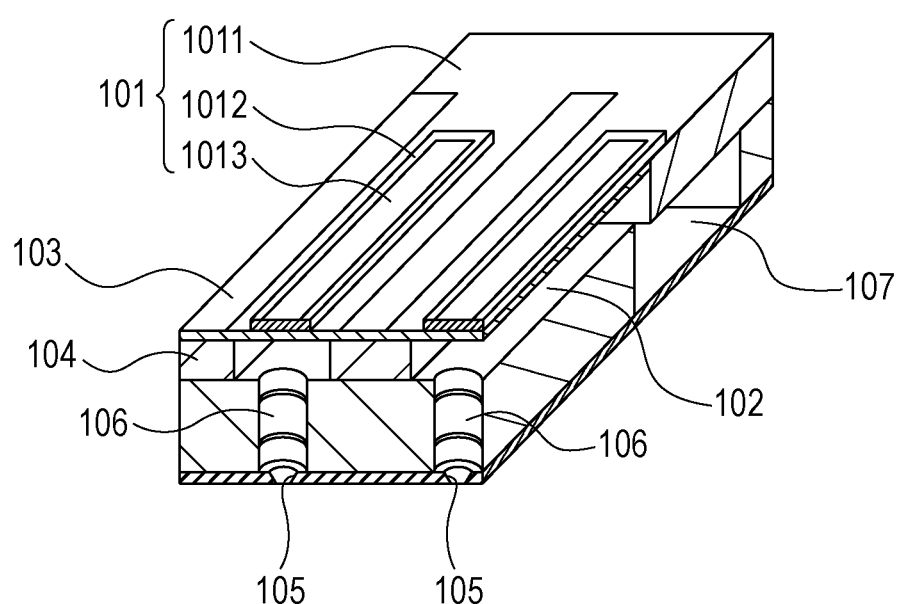

FIGS. 2A and 2B show a structure of a liquid discharge head according to one embodiment of the present invention. As shown in FIGS. 2A and 2B, the liquid discharge head includes a piezoelectric element 101. The piezoelectric element 101 includes a first electrode 1011, a piezoelectric material 1012, and a second electrode 1013. The piezoelectric material 1012 is patterned as needed as shown in FIG. 2B.

FIG. 2B is a schematic view of the liquid discharge head. The liquid discharge head includes discharge ports 105, individual liquid reservoirs 102, connecting holes 106 connecting the individual liquid reservoirs 102 to the discharge ports 105, partitions 104, a common liquid reservoir 107, a vibrating plate 103, and the piezoelectric element 101. Although the piezoelectric element 101 illustrated in the drawing has a rectangular shape, the shape may be any other shape, such as an elliptical shape, a circular shape, or a rectangular parallelepiped shape. In general, the piezoelectric material 1012 follows the shape of the individual liquid reservoir 102.

The piezoelectric element 101 and its nearby portion in the liquid discharge head will now be described in detail with reference to FIG. 2A. FIG. 2A is a cross-sectional view of the piezoelectric element shown in FIG. 2B taken in the width direction. Although the cross-sectional shape of the piezoelectric element 101 in the drawing is rectangular, the cross-sectional shape may be any other shape, such as a trapezoidal shape or an inverted trapezoidal shape.

In the drawing, the first electrode 1011 is used as a lower electrode and the second electrode 1013 is used as an upper electrode. However, the arrangement of the first electrode 1011 and the second electrode 1013 is not limited to this. For example, the first electrode 1011 may be used as the lower electrode or the upper electrode. The second electrode 1013 may be used as the upper electrode or the lower electrode. A buffer layer 108 may be present between the vibrating plate 103 and the lower electrode. Such differences in naming are derived from the device production method and effects of the present invention can be achieved in either case.

The vibrating plate 103 of the liquid discharge head moves in vertical directions as the piezoelectric material 1012 expands and contracts, and applies pressure to liquid in the individual liquid reservoir 102. As a result, liquid is ejected from the discharge port 105. The liquid discharge head can be used in printers and for production of electronic devices.

The thickness of the vibrating plate 103 is 1.0 µm or more and 15 µm or less and preferably 1.5 µm or more and 8 µm or less. The material for forming the vibrating plate 103 is not particularly limited but may be silicon. Silicon constituting the vibrating plate 103 may be doped with boron or phosphorus. The buffer layer 108 on the vibrating plate 103 and the electrode on the buffer layer 108 may constitute part of the vibrating plate 103. The thickness of the buffer layer 108 is 5 nm or more and 300 nm or less and preferably 10 nm or more and 200 nm or less. The size of the discharge port 105 is 5 µm or more and 40 µm or less in terms of circular equivalent diameter. The shape of the discharge port 105 may be circular, star-shaped, rectangular, or triangular, for example.

Liquid Discharge Apparatus

A liquid discharge apparatus according to an embodiment of the present invention will now be described. The liquid discharge apparatus includes the liquid discharge head described above.

Figure 6:
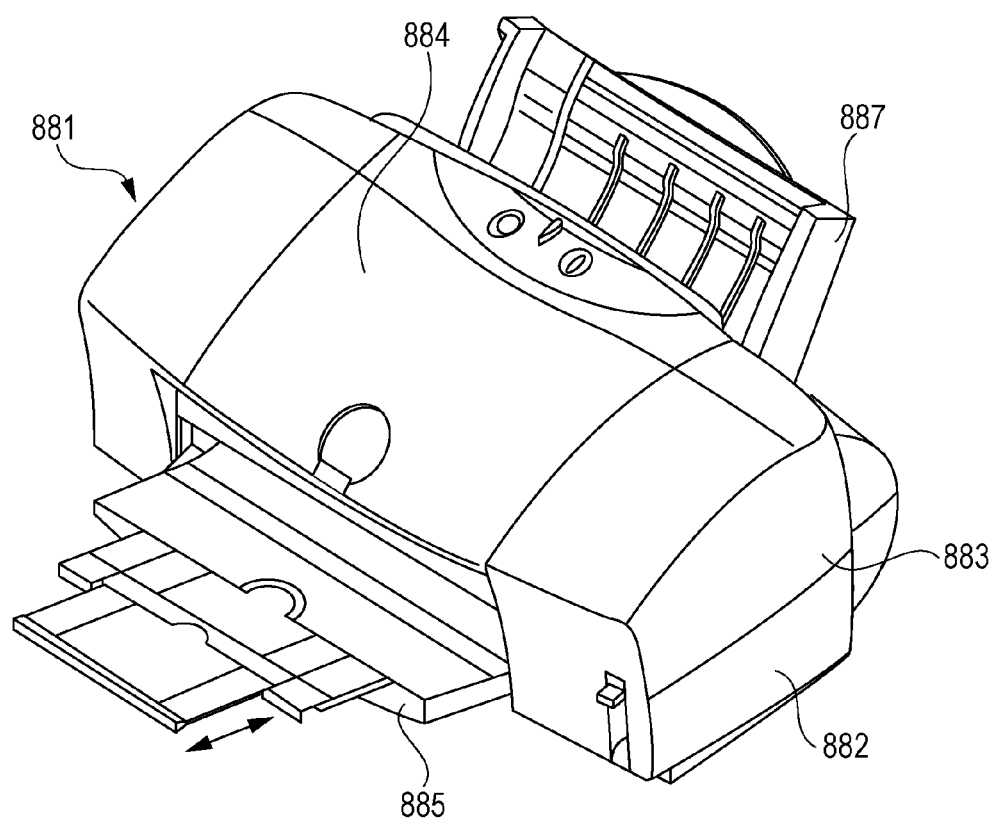
FIG. 6 is a schematic view showing a liquid discharge apparatus according to an embodiment of the invention.
Figure 7:
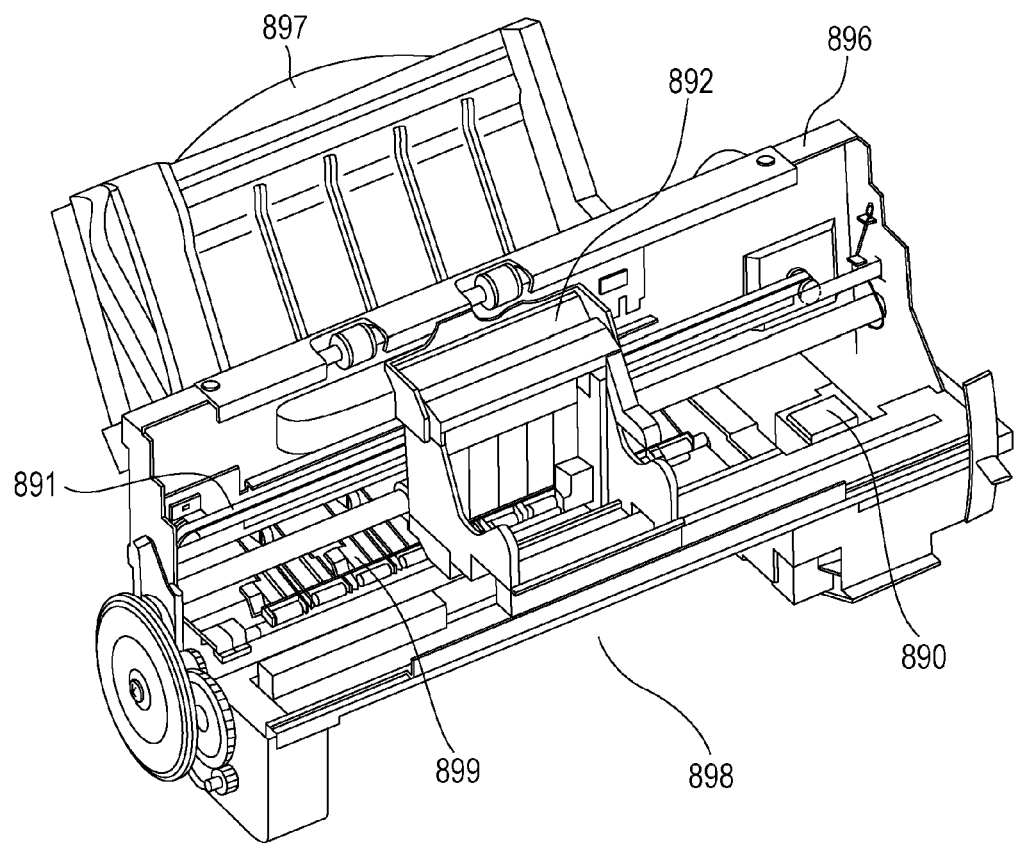
FIG. 7 is another schematic view showing the liquid discharge apparatus.

An example of the liquid discharge apparatus is an ink jet recording apparatus shown in FIGS. 6 and 7. FIG. 7 shows the state in which outer casings 882 to 885 and 887 are removed from a liquid discharge apparatus (ink jet recording apparatus) 881 shown in FIG. 6. The ink jet recording apparatus 881 includes an automatic feeding unit 897 configured to automatically feed a recording paper sheet, i.e., a recording medium, into a main body 896. The ink jet recording apparatus 881 also includes a transport unit 899 that guides the recording sheet fed from the automatic feeding unit 897 to a particular recording position and to a discharge slot 898 from the recording position, a recording unit 891 configured to conduct recording on the recording sheet transferred to the recording position, and a recovery unit 890 configured to conduct a recovery process on the recording unit 891. The recording unit 891 has a carriage 892 that houses the liquid discharge head and moves on a rail in a reciprocating manner.

When an electric signal is input to this ink jet recording apparatus from a computer, the carriage 892 moves on the rail and a driving voltage is applied to the electrodes sandwiching the piezoelectric material so that the piezoelectric material undergoes deformation. This deformation of the piezoelectric material pressurizes the individual liquid reservoir 102 via the vibrating plate 103 and causes ink to be ejected from the discharge port 105, thereby conducting printing.

This liquid discharge apparatus can eject liquid uniformly at a high speed and is small-sized. Although an example of a printer is described above, the liquid discharge apparatus may be used in industrial liquid discharge apparatuses and drawing apparatuses configured to draw images, characters, etc., on media in addition to printing apparatus such as facsimile machines, multifunction apparatuses, and ink jet recording apparatuses.

Ultrasonic Motor

An ultrasonic motor according to an embodiment of the present invention includes at least a moving member that contacts a vibrating member equipped with a piezoelectric material or multilayered piezoelectric element.

Figure 3A:
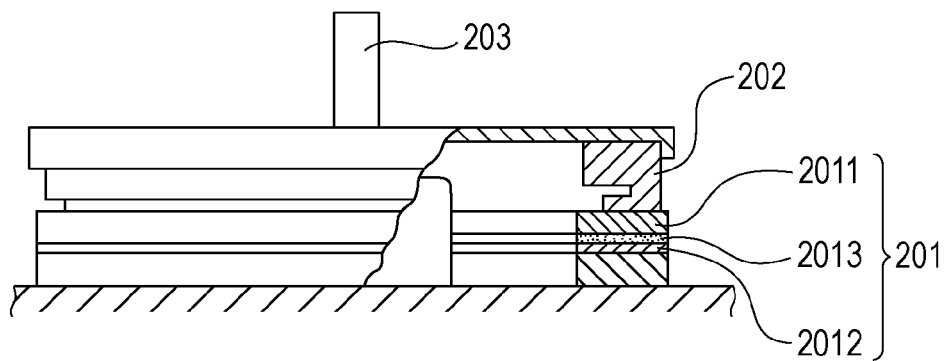
FIGS. 3A and 3B are each a schematic view showing an ultrasonic motor according to an embodiment of the invention.
Figure 3B:
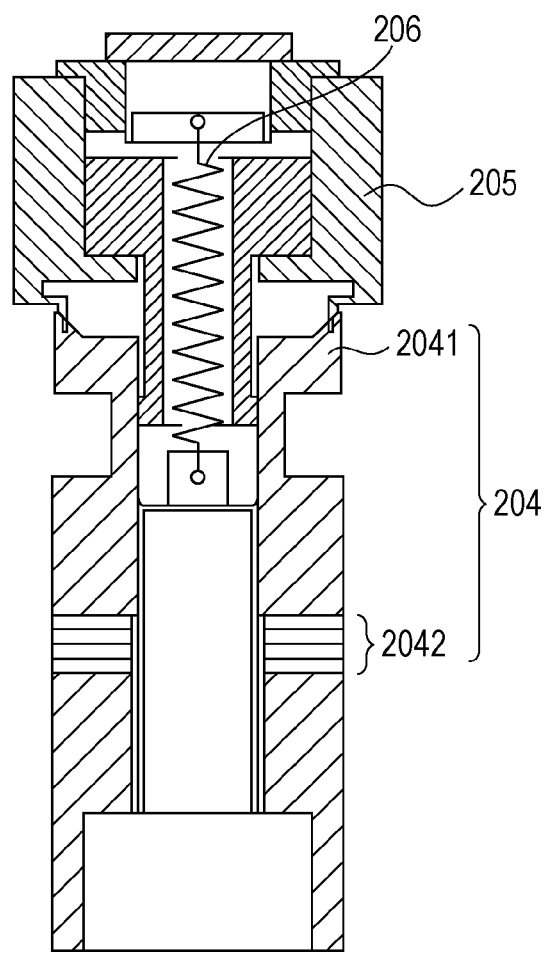
Figure 4:
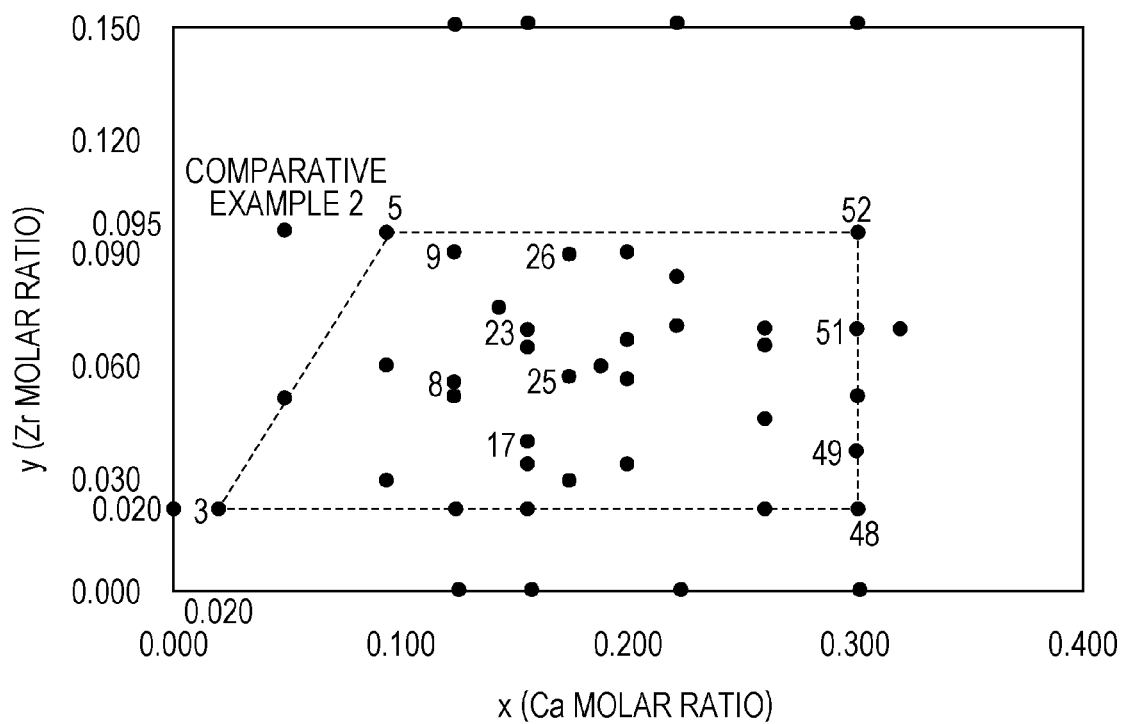
FIG. 4 is a graph showing the relationship between x and y of piezoelectric ceramics of Production Examples 1 to 73.

FIGS. 3A and 3B are each a schematic view showing a structure of an ultrasonic motor according to an embodiment of the present invention. FIG. 3A shows an ultrasonic motor that includes a piezoelectric element having a single-layer structure. The ultrasonic motor includes a vibrator 201, a rotor 202 pressure-contacting a sliding surface of the vibrator 201 due to the pressing force from a pressing spring (not shown in the drawing), and an output shaft 203 integral with the rotor 202. The vibrator 201 is constituted by, for example, a metal elastic ring 2011, a piezoelectric element 2012, and an organic adhesive 2013 (epoxy-based or cyanoacrylate-based adhesive, for example) that bonds the piezoelectric element 2012 to the elastic ring 2011. The piezoelectric element 2012 is composed of a piezoelectric material sandwiched between a first electrode and a second electrode which are not shown in the drawing.

When two phases of AC voltage that are different from each other by $\pi/2$ are applied to the piezoelectric element 2012, a bending traveling wave is generated in the vibrator 201 and each of the points on the sliding surface of the vibrator 201 undergoes elliptic motion. When the rotor 202 is in pressure-contact with the sliding surface of the vibrator 201, the vibrator 201 receives frictional force from the vibrator 201 and rotates in a direction opposite to that of the bending travelling wave. An object to be driven, which is not shown in the drawing, is joined to the output shaft 203 and is driven by the rotational force of the rotor 202. When voltage is applied to the piezoelectric material, the piezoelectric material expands and contracts due to the piezoelectric transversal effect. When an elastic member such as a metal member is in contact with the piezoelectric element, the elastic member is bent as the piezoelectric material expands and contracts. The ultrasonic motor described here is of a type that operates on this principle.

FIG. 3B shows an example of an ultrasonic motor including a piezoelectric element having a multilayered structure. A vibrator 204 includes a cylindrical metal elastic member 2041 and a multilayered piezoelectric element 2042 provided in the metal elastic member 2041. The multilayered piezoelectric element 2042 is constituted by a plurality layers of piezoelectric materials although this is not shown in the drawing. A first electrode and a second electrode are disposed on outer surfaces of the stack and inner electrodes are provided inside the stack. The metal elastic member 2041 is bolted to sandwich the multilayered piezoelectric element 2042 to thereby constitute the vibrator 204.

Application of different phases of AC voltage to the multilayered piezoelectric element 2042 causes the vibrator 204 to excite two vibrations orthogonal to each other. These two vibrations are combined into a circular vibration that drives the tip of the vibrator 204. An annular groove is formed in the upper part of the vibrator 204 to increase the displacement of the vibration for drive. A rotor 205 pressure-contacts the vibrator 204 due to a pressurizing spring 206 and receives frictional force for drive. The rotor 205 is rotatably supported on bearings.

Optical Apparatus

Next an optical apparatus according to an embodiment of the present invention is described. The optical apparatus includes an ultrasonic motor in a drive unit.

Figure 8A:
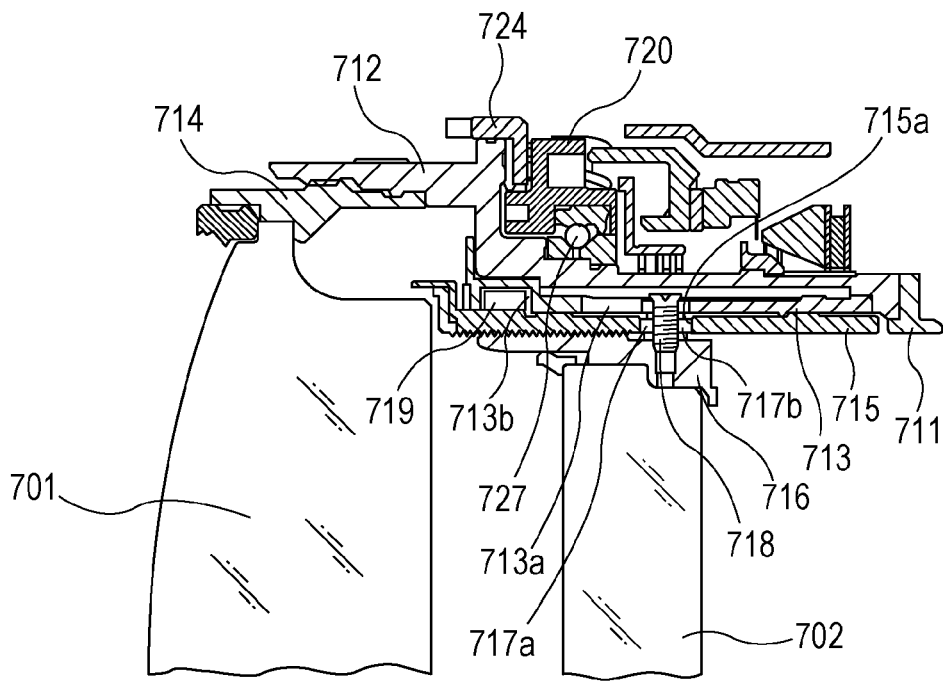
FIGS. 8A and 8B are schematic views showing an optical apparatus according to an embodiment of the invention.
Figure 8B:
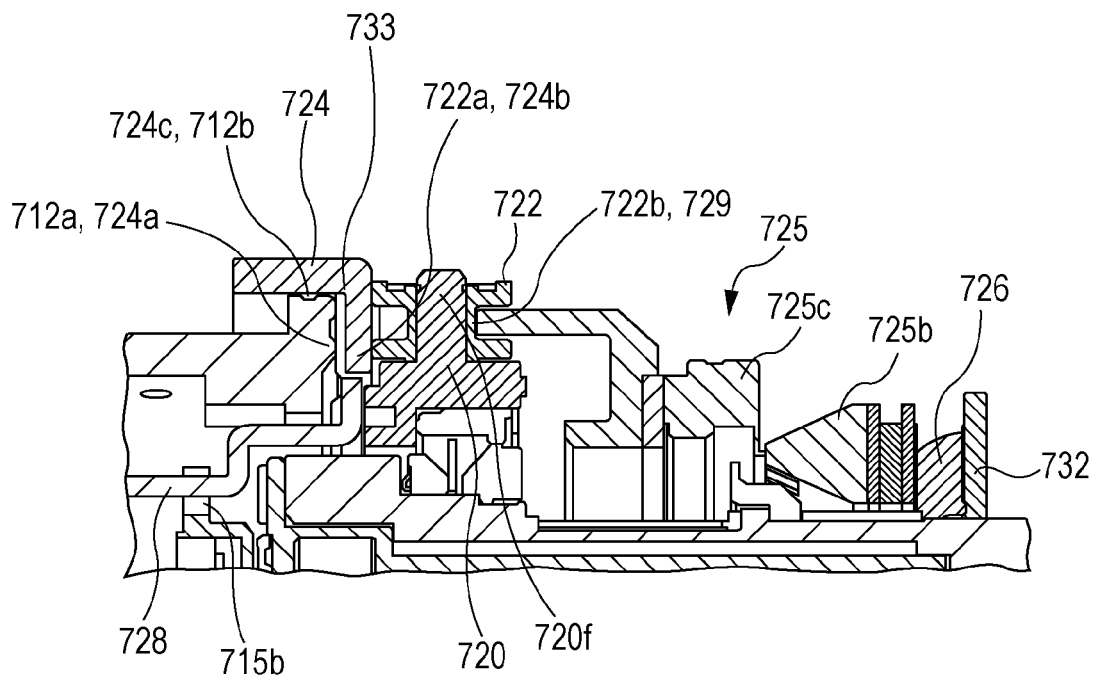
Figure 9:
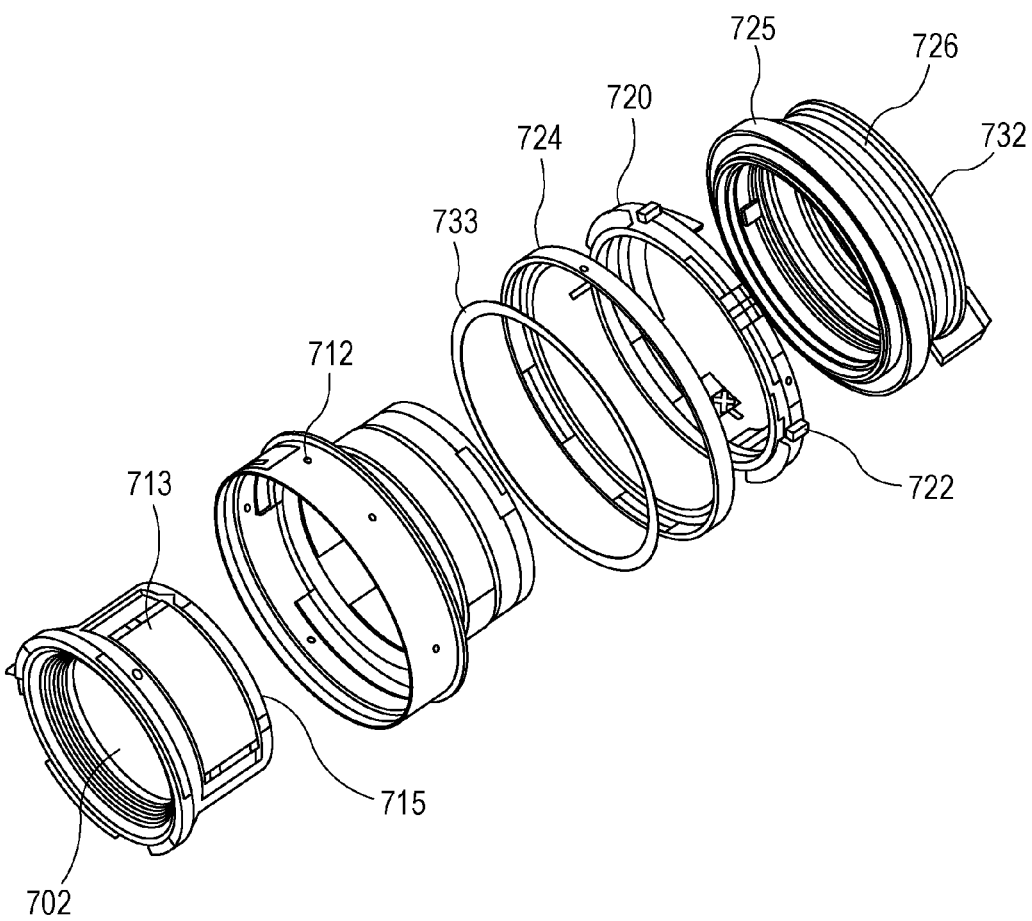
FIG. 9 is a schematic view showing the optical apparatus.

FIGS. 8A and 8B are each a cross-sectional view of a related part of a replaceable lens barrel of a single-lens reflex camera, which is an example of an imaging apparatus according to an embodiment of the present invention. FIG. 9 is an exploded perspective view of the replaceable lens barrel.

Referring to FIGS. 8A, 8B, and 9, a fixed barrel 712, linear guide barrel 713, and a front lens group barrel 714 are fixed to a mount 711 detachable from and attachable to a camera. These are fixed members of the replaceable lens barrel.

A linear guide groove 713a extending in an optical axis direction is formed in the linear guide barrel 713 to guide a focus lens 702. A cam roller 717a and a cam roller 717b protruding in an outer radial direction are fixed with a shaft screw 718 to a rear lens group barrel 716 holding the focus lens 702. The cam roller 717a is fitted in the linear guide groove 713a.

A cam ring 715 is rotatably fitted to the inner periphery of the linear guide barrel 713. Relative movements between the linear guide barrel 713 and the cam ring 715 in the optical axis direction is inhibited since a roller 719 fixed to the cam ring 715 is fitted in an annular groove 713b of the linear guide barrel 713. A cam groove 715a for the focus lens 702 is formed in the cam ring 715. The cam roller 717b is fitted in the cam groove 715a.

A rotation transmitting ring 720 is provided on the outer peripheral side of the fixed barrel 712. The rotation transmitting ring 720 is held by a ball race 727 so that it can rotate at a particular position relative to the fixed barrel 712. A roller 722 is rotatably held by a shaft 720f extending in a radial manner from the rotation transmitting ring 720, and a large-diameter portion 722a of the roller 722 is in contact with a mount-side end surface 724b of a manual focus ring 724. A small-diameter portion 722b of the roller 722 is in contact with a joint member 729. Six equally spaced rollers 722 are arranged on the outer periphery of the rotation transmitting ring 720 and each roller is configured to have the above-described relationship.

A low-friction sheet (washer member) 733 is arranged on the inner radial portion of the manual focus ring 724. The low-friction sheet 733 is interposed between a mount-side end surface 712a of the fixed barrel 712 and a front-side end surface 724a of the manual focus ring 724. The outer radial surface of the low-friction sheet 733 has a ring shape and is fitted in an inner radial portion 724c of the manual focus ring 724. The inner radial portion 724c of the manual focus ring 724 is fitted in an outer radial portion 712b of the fixed barrel 712. The low-friction sheet 733 reduces the friction in a rotary ring mechanism in which the manual focus ring 724 is rotated relative to the fixed barrel 712 about the optical axis.

The large-diameter portion 722a of the roller 722 and a mount-side end surface 724b of the manual focus ring 724 contact each other under pressure by being pressed by a wave washer 726 that presses an ultrasonic motor 725 toward the front side of the lens. The force from the wave washer 726 pressing the ultrasonic motor 725 toward the front side of the lens also causes the small-diameter portion 722b of the roller 722 and the joint member 729 to contact each other under an adequate degree of pressure. The wave washer 726 is confined from moving in the mount direction by a washer 732 bayonet-mounted to the fixed barrel 712. The spring force (urging force) generated by the wave washer 726 is transmitted to the ultrasonic motor 725 and to the roller 722 and serves as thrusting force of the manual focus ring 724 against the mount-side end surface 712a of the fixed barrel 712. In other words, the manual focus ring 724 is assembled while being urged against the mount-side end surface 712a of the fixed barrel 712 via the low-friction sheet 733.

Accordingly, when the ultrasonic motor 725 is driven and rotated with respect to the fixed barrel 712 by a controlling unit not shown in the drawing, the roller 722 rotates about the center of the shaft 720f because the joint member 729 makes frictional contact with the small-diameter portion 722b of the roller 722. As the roller 722 rotates about the shaft 720f, the rotation transmitting ring 720 is rotated about the optical axis (automatic focusing operation).

When rotation force about the optical axis is applied to the manual focus ring 724 from a manual operation input unit not shown in the drawing, the roller 722 rotates about the shaft 720f since the mount-side end surface 724b of the manual focus ring 724 is in pressure-contact with the large-diameter portion 722a of the roller 722. As the large-diameter portion 722a of the roller 722 rotates about the shaft 720f, the rotation transmitting ring 720 is rotated about the optical axis. The ultrasonic motor 725 at this time is prevented from rotating due to the frictional retention force of a rotor 725c and a stator 725b (manual focusing operation).

Two focus keys 728 are installed in the rotation transmitting ring 720 at positions opposite to each other and fitted in notches 715b at the front tip of the cam ring 715. When automatic focusing operation or manual focusing operation is conducted and the rotation transmitting ring 720 is rotated about the optical axis, the rotation force is transmitted to the cam ring 715 via the focus keys 728. When the cam ring 715 is rotated about the optical axis, a rear lens group barrel 716 inhibited from rotating due to the cam roller 717a and the linear guide groove 713a moves back and forth along the cam groove 715a in the cam ring 715 by the cam roller 717b. This drives the focus lens 702 and focusing operation is conducted.

Although a replaceable lens barrel of a single-lens reflex camera has been described as an example of the optical apparatus of the present invention, the range of the optical apparatus is not limited to this. The optical apparatus may be any type of camera such as a compact camera, an electronic still camera, or the like, or may be a portable information terminal equipped with a camera. An optical apparatus having an ultrasonic motor in a driver unit is also within the range of the present invention.

Electronic Apparatus

An electronic apparatus according to an embodiment of the present invention will now be described. An electronic apparatus according to an embodiment includes a piezoelectric acoustic component equipped with a piezoelectric element or multilayered piezoelectric element. The piezoelectric acoustic component may be a speaker, a microphone, a surface acoustic wave (SAW) device, or the like.

Figure 10:
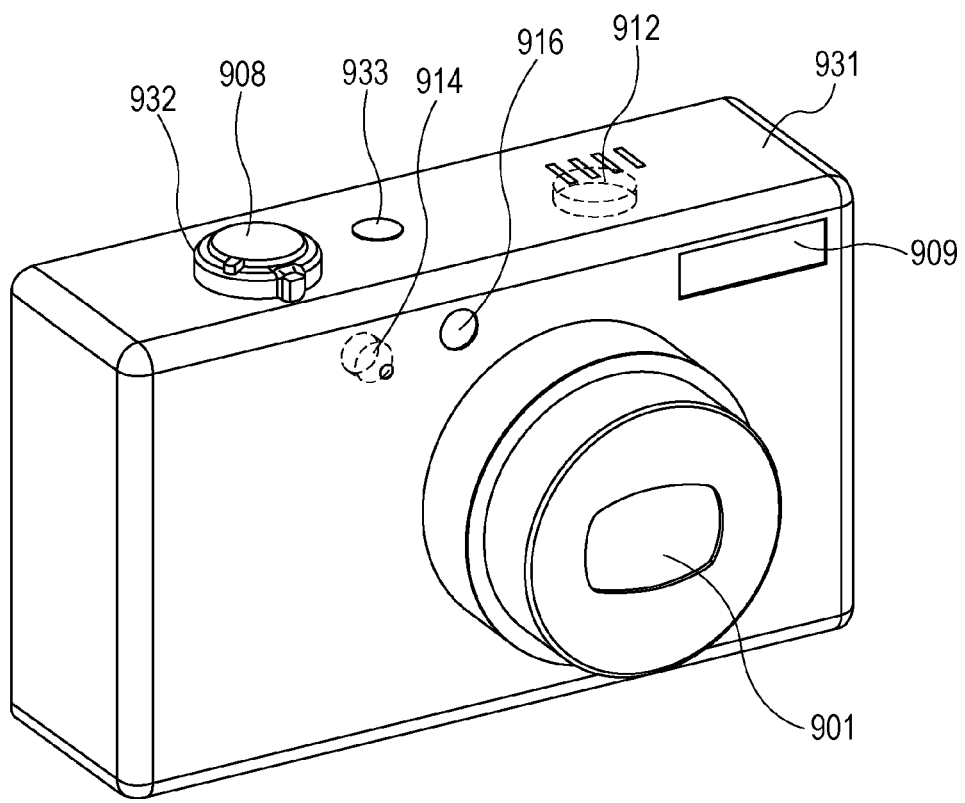
FIG. 10 is a schematic view showing an electronic apparatus according to an embodiment of the invention.

FIG. 10 is a perspective view of a digital camera, which is an example of the electronic apparatus according to the present invention, as viewed from the front of a main body 931. An optical device 901, a microphone 914, a strobe light unit 909, and an auxiliary light unit 916 are installed in the front face of the main body 931. Since the microphone 914 is assembled inside the main body, it is indicated by a broken line. A hole for collecting sound from outside is formed at the front of the microphone 914.

A power button 933, a speaker 912, a zoom lever 932, and a release button 908 for executing focusing operation are installed in the upper surface of the main body 931. The speaker 912 is built inside the main body 931 and is indicated by a broken line. Holes for outputting sound are formed at the front of the speaker 912.

The piezoelectric acoustic component is used in at least one of the microphone 914, speaker 912, and a SAW device.

Although a digital camera is described as one example of the electronic apparatus of the present invention, the electronic apparatus is not limited to this and may be any electronic apparatus equipped with a piezoelectric acoustic component, such as a sound-reproducing apparatus, a sound-recording apparatus, a cellular phone, and an information terminal.

As has been described above, the embodiments of the piezoelectric element and the multilayered piezoelectric element described above are suitable for use in a liquid discharge head, a liquid discharge apparatus, an ultrasonic motor, an optical apparatus, and an electronic apparatus.

When the piezoelectric element or the multilayered piezoelectric element of the present invention is used, a liquid discharge head that has a nozzle density and discharge force comparable or superior to a liquid discharge head that includes a lead-containing piezoelectric element can be provided. A liquid discharge apparatus equipped with a liquid discharge head according to an embodiment of the present invention can exhibit discharge force and discharge accuracy comparable or superior to a liquid discharge apparatus that uses a liquid discharge head including a lead-containing piezoelectric element.

An ultrasonic motor that uses the piezoelectric element or the multilayered piezoelectric element according to an embodiment of the present invention exhibits driving force and durability comparable or superior to an ultrasonic motor that uses a lead-containing piezoelectric element. An optical apparatus that uses the ultrasonic motor can exhibit durability and operation accuracy comparable or superior to an optical apparatus that uses an ultrasonic motor that includes a lead-containing piezoelectric element. An electronic apparatus that uses a piezoelectric acoustic component equipped with a piezoelectric element or multilayered piezoelectric element according to an embodiment of the present invention exhibits a sound-generating property comparable or superior to an electronic apparatus that includes a lead-containing piezoelectric element.

EXAMPLES

The present invention will now be described in more detail by using examples which do not limit the scope of the invention.

A piezoelectric ceramic for use in a piezoelectric element was prepared.

Production Example 1

Barium titanate having an average particle diameter of 100 nm (BT-01 produced by Sakai Chemical Industry Co., Ltd.), calcium titanate having an average particle diameter of 300 nm (CT-03 produced by Sakai Chemical Industry Co., Ltd.), and calcium zirconate having an average particle diameter of 300 nm (CZ-03 produced by Sakai Chemical Industry Co., Ltd.) were weighed so that the ratio was 90.5:6.5:3.0 on a molar basis. In order to adjust the molar ratio a of Ba and Ca in A sites to Ti and Zr in B sites, 0.008 mol of barium oxalate was added. The resulting mixture was dry-mixed in a ball mill for 24 hours. To the resulting mixture, 0.08 parts by weight of manganese(II) acetate on a manganese metal basis and 3 parts by weight of a PVA binder relative to the mixed powder were caused to adhere to surfaces of the mixed powder by using a spray dryer in order to granulate the mixed powder.

The granulated powder was charged in a mold and pressed under 200 MPa of forming pressure with a press-molding machine to prepare a disk-shaped compact. The compact may be further pressed by using a cold isostatic press-molding machine.

The compact was placed in an electric furnace and sintered in an air atmosphere for a total of 24 hours during which a maximum temperature of 1400° C. was retained for 5 hours.

The average circular equivalent diameter and the relative density of crystal grains constituting the resulting ceramic were evaluated. The average circular equivalent diameter was 6.2 μm and the relative density was 94.9%. A polarizing microscope was mainly used to observe crystal grains. The diameter of small crystal grains was determined by using a scanning electron microscope (SEM). The average circular equivalent diameter was calculated on the basis of the observation results. The relative density was evaluated by the Archimedean method.

The ceramic was polished to a thickness of 0.5 mm and the crystal structure of the ceramic was analyzed by X-ray diffraction. As a result, only peaks attributable to a perovskite-type structure were observed.

The composition of the ceramic was analyzed by X-ray fluorescence analysis. The results found that 0.08 parts by weight of Mn was incorporated in a composition expressed by a chemical formula, $(Ba_{0.905}Ca_{0.095})_{1.002}(Ti_{0.97}Zr_{0.03})O_3$. This means that the composition prepared by weighing matches the composition after sintering. The contents of the elements other than Ba, Ca, Ti, Zr, and Mn were below detection limits, i.e., less than 0.1 parts by weight.

The crystal grains were observed again. However, the average circular equivalent diameter was not much different between before and after polishing.

Production Examples 2 to 52, 72, and 73

Barium titanate having an average particle diameter of 100 nm (BT-01 produced by Sakai Chemical Industry Co., Ltd.), calcium titanate having an average particle diameter of 300 nm (CT-03 produced by Sakai Chemical Industry Co., Ltd.), and calcium zirconate having an average particle diameter of 300 nm (CZ-03 produced by Sakai Chemical Industry Co., Ltd.) were weighed so that the ratio on a molar basis was as shown in Tables 1-1 and 1-2. In order to adjust the molar ratio a of Ba and Ca in A sites to Ti and Zr in B sites, barium oxalate in an amount indicated in Tables 1-1 and 1-2 was weighed. These powders were dry-mixed in a ball mill for 24 hours. In Example 48, 0.8 parts by weight of Si on an oxide basis was added as an auxiliary component. In Example 52, a total of 1.0 parts by weight of Si and Cu on an oxide basis were added as auxiliary components. To the resulting mixture, manganese(II) acetate in an amount on a manganese metal basis shown in Tables 1-1 and 1-2 and 3 parts by weight of a PVA binder relative to the mixed powder were caused to adhere to surfaces of the mixed powder by using a spray dryer in order to granulate the mixed powder.

The granulated powder was charged in a mold and pressed under 200 MPa of forming pressure with a press-molding machine to prepare a disk-shaped compact. The compact may be further pressed by using a cold isostatic press-molding machine.

The compact was placed in an electric furnace and sintered in an air atmosphere for a total of 24 hours, during which a maximum temperature of 1350° C. to 1480° C. was retained for 5 hours. The maximum temperature was increased as the amount of Ca was increased.

The average circular equivalent diameter and the relative density of crystal grains constituting the resulting ceramic were evaluated. The results are shown in Tables 2-1 and 2-2. A polarizing microscope was mainly used to observe crystal grains. The diameter of small crystal grains was determined by using a scanning electron microscope (SEM). The average circular equivalent diameter was calculated on the basis of the observation results. The relative density was evaluated by the Archimedean method.

The ceramic was polished to a thickness of 0.5 mm and the crystal structure of the ceramic was analyzed by X-ray diffraction. As a result, only peaks attributable to a perovskite-type structure were observed in all samples.

The composition of the ceramic was analyzed by X-ray fluorescence analysis. The results are shown in Tables 3-1 and 3-2. In the table, auxiliary components refer to elements other than Ba, Ca, Ti, Zr, and Mn and 0 means that the content was below the detection limit. As a result, it was found that the composition prepared by weighing matched the composition after sintering in all samples.

The crystal grains were observed again. However, the size and conditions of the crystal grains were not much different between after sintering and after polishing.

Production Examples 53 to 71 for Comparison

The same raw material powders as those in Examples 1 to 52, 72, and 73 and barium zirconate having an average particle diameter of 300 nm (produced by Nippon Chemical Industrial Co., Ltd.) were weighed so that the molar ratio was as shown in Tables 1-1 and 1-2. Each mixture was dry-mixed in a ball mill for 24 hours. In Production Example 65, Y and V in a total amount of 2.1 parts by weight on an oxide basis were added. To the resulting mixture, manganese (II) acetate in an amount on a manganese metal basis indicated in Tables 1-1 and 1-2 and 3 parts by weight of a PVA binder relative to the mixed powder were caused to adhere to surfaces of mixed powder by using a spray dryer in order to granulate the mixed powder.

A ceramic was prepared under the same conditions as in Examples 2 to 52, 72, and 73 by using each of the resulting granulated powders. The average circular equivalent diameter and the relative density of crystal grains constituting the ceramic were evaluated. The results are shown in Tables 2-1 and 2-2. Evaluation of the crystal grains and the relative density was conducted as in Examples 1 to 52, 72, and 73.

Each resulting ceramic was polished to a thickness of 0.5 mm and the crystal structure of the ceramic was analyzed by X-ray diffraction. As a result, only peaks attributable to a perovskite-type structure were observed in all samples.

The composition of the ceramic was analyzed by X-ray fluorescence analysis. The results are shown in Tables 3-1 and 3-2. As a result, it was found that the composition prepared by weighing matched the composition after sintering in all samples.

The relationship between x and y in the piezoelectric materials of Production Examples 1 to 73 is shown in the graph of FIG. 1. In the figure, the range marked by a broken line indicates the range of x and y of general formula (1) representing the perovskite-type metal oxide described in the embodiment.

TABLE 1-1

|  | $BaTiO_3$ [mol] | $CaTiO_3$ [mol] | $CaZrO_3$ [mol] | $BaZrO_3$ [mol] | $BaC_2O_4$ [mol] | Mn content [parts by weight] | Auxiliary components [parts by weight] |
|---|---|---|---|---|---|---|---|
| Production Example 1 | 90.5 | 6.5 | 3.0 | 0.0 | 0.008 | 0.08 | 0.0 |
| Production Example 2 | 95.0 | 0.0 | 5.0 | 0.0 | 0.009 | 0.10 | 0.0 |
| Production Example 3 | 98.0 | 0.0 | 2.0 | 0.0 | 0.008 | 0.10 | 0.0 |
| Production Example 4 | 90.5 | 3.5 | 6.0 | 0.0 | 0.006 | 0.08 | 0.0 |
| Production Example 5 | 90.5 | 0.0 | 9.5 | 0.0 | 0.006 | 0.06 | 0.0 |
| Production Example 6 | 87.5 | 10.5 | 2.0 | 0.0 | 0.009 | 0.08 | 0.0 |
| Production Example 7 | 87.5 | 7.5 | 5.0 | 0.0 | 0.006 | 0.06 | 0.0 |
| Production Example 8 | 87.5 | 7.0 | 5.5 | 0.0 | 0.005 | 0.06 | 0.0 |
| Production Example 9 | 87.5 | 3.5 | 9.0 | 0.0 | 0.005 | 0.06 | 0.0 |
| Production Example 10 | 86.0 | 6.5 | 7.5 | 0.0 | 0.006 | 0.02 | 0.0 |
| Production Example 11 | 86.0 | 6.5 | 7.5 | 0.0 | 0.003 | 0.02 | 0.0 |
| Production Example 12 | 86.0 | 6.5 | 7.5 | 0.0 | 0.008 | 0.07 | 0.0 |
| Production Example 13 | 86.0 | 6.5 | 7.5 | 0.0 | 0.005 | 0.07 | 0.0 |
| Production Example 14 | 86.0 | 6.5 | 7.5 | 0.0 | 0.007 | 0.08 | 0.0 |

TABLE 1-1-continued

|  | BaTiO$_3$ [mol] | CaTiO$_3$ [mol] | CaZrO$_3$ [mol] | BaZrO$_3$ [mol] | BaC$_2$O$_4$ [mol] | Mn content [parts by weight] | Auxiliary components [parts by weight] |
| --- | --- | --- | --- | --- | --- | --- | --- |
| Production Example 15 | 84.5 | 13.5 | 2.0 | 0.0 | 0.014 | 0.15 | 0.0 |
| Production Example 16 | 84.5 | 12.0 | 3.5 | 0.0 | 0.016 | 0.18 | 0.0 |
| Production Example 17 | 84.5 | 11.4 | 4.1 | 0.0 | 0.014 | 0.18 | 0.0 |
| Production Example 18 | 84.5 | 9.0 | 6.5 | 0.0 | 0.003 | 0.02 | 0.0 |
| Production Example 19 | 84.5 | 9.0 | 6.5 | 0.0 | 0.006 | 0.06 | 0.0 |
| Production Example 20 | 84.5 | 9.0 | 6.5 | 0.0 | 0.009 | 0.06 | 0.0 |
| Production Example 21 | 84.5 | 9.0 | 6.5 | 0.0 | 0.008 | 0.10 | 0.0 |
| Production Example 22 | 84.5 | 9.0 | 6.5 | 0.0 | 0.012 | 0.10 | 0.0 |
| Production Example 23 | 84.5 | 8.6 | 6.9 | 0.0 | 0.014 | 0.18 | 0.0 |
| Production Example 24 | 82.5 | 14.5 | 3.0 | 0.0 | 0.013 | 0.15 | 0.0 |
| Production Example 25 | 82.5 | 12.0 | 5.5 | 0.0 | 0.009 | 0.06 | 0.0 |
| Production Example 26 | 82.5 | 8.5 | 9.0 | 0.0 | 0.014 | 0.10 | 0.0 |
| Production Example 27 | 81.3 | 12.7 | 6.0 | 0.0 | 0.009 | 0.12 | 0.0 |
| Production Example 28 | 81.3 | 12.7 | 6.0 | 0.0 | 0.017 | 0.18 | 0.0 |
| Production Example 29 | 81.3 | 12.7 | 6.0 | 0.0 | 0.013 | 0.18 | 0.0 |
| Production Example 30 | 81.3 | 12.7 | 6.0 | 0.0 | 0.021 | 0.24 | 0.0 |
| Production Example 31 | 81.3 | 12.7 | 6.0 | 0.0 | 0.015 | 0.24 | 0.0 |
| Production Example 32 | 81.3 | 12.7 | 6.0 | 0.0 | 0.023 | 0.30 | 0.0 |
| Production Example 33 | 80.0 | 16.5 | 3.5 | 0.0 | 0.017 | 0.20 | 0.0 |
| Production Example 34 | 80.0 | 14.5 | 5.5 | 0.0 | 0.017 | 0.22 | 0.0 |
| Production Example 35 | 80.0 | 13.0 | 7.0 | 0.0 | 0.019 | 0.24 | 0.0 |
| Production Example 36 | 80.0 | 11.0 | 9.0 | 0.0 | 0.019 | 0.26 | 0.0 |
| Production Example 37 | 78.0 | 19.0 | 3.0 | 0.0 | 0.017 | 0.22 | 0.0 |
| Production Example 38 | 78.0 | 15.5 | 6.5 | 0.0 | 0.014 | 0.15 | 0.0 |
| Production Example 39 | 78.0 | 15.5 | 6.5 | 0.0 | 0.011 | 0.15 | 0.0 |
| Production Example 40 | 78.0 | 15.5 | 6.5 | 0.0 | 0.018 | 0.20 | 0.0 |

TABLE 1-2

|  | BaTiO$_3$ [mol] | CaTiO$_3$ [mol] | CaZrO$_3$ [mol] | BaZrO$_3$ [mol] | BaC$_2$O$_4$ [mol] | Mn content [parts by weight] | Auxiliary components [parts by weight] |
| --- | --- | --- | --- | --- | --- | --- | --- |
| Production Example 41 | 78.0 | 15.5 | 6.5 | 0.0 | 0.017 | 0.20 | 0.0 |
| Production Example 42 | 78.0 | 15.5 | 6.5 | 0.0 | 0.018 | 0.25 | 0.0 |
| Production Example 43 | 78.0 | 14.0 | 8.0 | 0.0 | 0.020 | 0.28 | 0.0 |
| Production Example 44 | 74.0 | 24.0 | 2.0 | 0.0 | 0.018 | 0.22 | 0.0 |
| Production Example 45 | 74.0 | 21.5 | 4.5 | 0.0 | 0.017 | 0.24 | 0.0 |
| Production Example 46 | 74.0 | 19.5 | 6.5 | 0.0 | 0.017 | 0.26 | 0.0 |
| Production Example 47 | 74.0 | 19.0 | 7.0 | 0.0 | 0.019 | 0.28 | 0.0 |
| Production Example 48 | 70.0 | 28.0 | 2.0 | 0.0 | 0.018 | 0.26 | 0.8 |
| Production Example 49 | 70.0 | 25.9 | 4.1 | 0.0 | 0.021 | 0.26 | 0.0 |
| Production Example 50 | 70.0 | 25.0 | 5.0 | 0.0 | 0.020 | 0.28 | 0.0 |
| Production Example 51 | 70.0 | 23.1 | 6.9 | 0.0 | 0.024 | 0.30 | 0.0 |
| Production Example 52 | 70.0 | 20.5 | 9.5 | 0.0 | 0.023 | 0.30 | 1.0 |
| Production Example 53 | 98.0 | 0.0 | 0.0 | 2.0 | 0.004 | 0.00 | 0.0 |
| Production Example 54 | 90.5 | 5.0 | 0.0 | 4.5 | 0.005 | 0.02 | 0.0 |
| Production Example 55 | 87.5 | 12.5 | 0.0 | 0.0 | 0.009 | 0.08 | 0.0 |
| Production Example 56 | 72.5 | 12.5 | 0.0 | 15.0 | 0.005 | 0.06 | 0.0 |

TABLE 1-2-continued

| | BaTiO$_3$ [mol] | CaTiO$_3$ [mol] | CaZrO$_3$ [mol] | BaZrO$_3$ [mol] | BaC$_2$O$_4$ [mol] | Mn content [parts by weight] | Auxiliary components [parts by weight] |
|---|---|---|---|---|---|---|---|
| Production Example 57 | 84.5 | 15.5 | 0.0 | 0.0 | 0.014 | 0.15 | 0.0 |
| Production Example 58 | 69.5 | 15.5 | 0.0 | 15.0 | 0.014 | 0.18 | 0.0 |
| Production Example 59 | 78.0 | 22.0 | 0.0 | 0.0 | 0.017 | 0.22 | 0.0 |
| Production Example 60 | 63.0 | 22.0 | 0.0 | 15.0 | 0.021 | 0.28 | 0.0 |
| Production Example 61 | 70.0 | 30.0 | 0.0 | 0.0 | 0.018 | 0.26 | 0.0 |
| Production Example 62 | 55.0 | 30.0 | 0.0 | 15.0 | 0.000 | 0.30 | 0.0 |
| Production Example 63 | 68.0 | 25.5 | 6.5 | 0.0 | 0.011 | 0.15 | 0.0 |
| Production Example 64 | 81.3 | 12.7 | 6.0 | 0.0 | 0.000 | 0.18 | 0.0 |
| Production Example 65 | 78.0 | 15.5 | 6.5 | 0.0 | 0.014 | 0.15 | 2.1 |
| Production Example 66 | 81.3 | 12.7 | 6.0 | 0.0 | 0.040 | 0.18 | 0.0 |
| Production Example 67 | 86.0 | 6.5 | 7.5 | 0.0 | 0.005 | 0.00 | 0.0 |
| Production Example 68 | 81.3 | 12.7 | 6.0 | 0.0 | 0.029 | 0.45 | 0.0 |
| Production Example 69 | 78.0 | 15.5 | 6.5 | 0.0 | 0.014 | 0.15 | 0.0 |
| Production Example 70 | 78.0 | 15.5 | 6.5 | 0.0 | 0.014 | 0.15 | 0.0 |
| Production Example 71 | 78.0 | 15.5 | 6.5 | 0.0 | 0.014 | 0.15 | 0.0 |
| Production Example 72 | 81.3 | 12.7 | 6.0 | 0.0 | 0.029 | 0.40 | 0.0 |
| Production Example 73 | 84.0 | 10.1 | 5.9 | 0.0 | 0.028 | 0.40 | 0.0 |

TABLE 2-1

| | | Average circular equivalent diameter [μm] | Relative density [%] |
|---|---|---|---|
| Example 1 | Production Example 1 | 6.2 | 94.9 |
| Example 2 | Production Example 2 | 6.7 | 94.0 |
| Example 3 | Production Example 3 | 6.0 | 94.1 |
| Example 4 | Production Example 4 | 7.8 | 94.7 |
| Example 5 | Production Example 5 | 6.6 | 94.8 |
| Example 6 | Production Example 6 | 2.7 | 94.9 |
| Example 7 | Production Example 7 | 6.1 | 94.8 |
| Example 8 | Production Example 8 | 7.7 | 94.9 |
| Example 9 | Production Example 9 | 6.5 | 95.3 |
| Example 10 | Production Example 10 | 7.8 | 91.8 |
| Example 11 | Production Example 11 | 7.1 | 94.5 |
| Example 12 | Production Example 12 | 8.6 | 95.1 |
| Example 13 | Production Example 13 | 6.9 | 95.3 |
| Example 14 | Production Example 14 | 6.1 | 94.7 |
| Example 15 | Production Example 15 | 5.8 | 96.8 |
| Example 16 | Production Example 16 | 2.4 | 94.4 |
| Example 17 | Production Example 17 | 10.4 | 94.6 |
| Example 18 | Production Example 18 | 6.7 | 92.7 |
| Example 19 | Production Example 19 | 6.8 | 93.8 |
| Example 20 | Production Example 20 | 9.6 | 93.9 |
| Example 21 | Production Example 21 | 5.5 | 94.7 |
| Example 22 | Production Example 22 | 10.8 | 93.8 |
| Example 23 | Production Example 23 | 5.7 | 94.8 |
| Example 24 | Production Example 24 | 5.3 | 94.9 |
| Example 25 | Production Example 25 | 4.3 | 94.4 |
| Example 26 | Production Example 26 | 7.1 | 94.3 |
| Example 27 | Production Example 27 | 6.7 | 94.2 |
| Example 28 | Production Example 28 | 8.8 | 95.1 |
| Example 29 | Production Example 29 | 5.5 | 97.5 |
| Example 30 | Production Example 30 | 3.1 | 95.6 |
| Example 31 | Production Example 31 | 3.2 | 97.1 |
| Example 32 | Production Example 32 | 4.2 | 98.0 |
| Example 33 | Production Example 33 | 2.1 | 95.6 |
| Example 34 | Production Example 34 | 5.6 | 98.7 |
| Example 35 | Production Example 35 | 5.4 | 98.5 |
| Example 36 | Production Example 36 | 6.2 | 97.0 |
| Example 37 | Production Example 37 | 4.1 | 95.5 |
| Example 38 | Production Example 38 | 4.0 | 94.9 |
| Example 39 | Production Example 39 | 3.9 | 96.0 |
| Example 40 | Production Example 40 | 5.2 | 96.2 |

TABLE 2-2

| | | Average circular equivalent diameter [μm] | Relative density [%] |
|---|---|---|---|
| Example 41 | Production Example 41 | 6.3 | 97.1 |
| Example 42 | Production Example 42 | 4.9 | 97.4 |
| Example 43 | Production Example 43 | 5.4 | 96.4 |
| Example 44 | Production Example 44 | 5.7 | 95.9 |
| Example 45 | Production Example 45 | 6.1 | 96.2 |
| Example 46 | Production Example 46 | 6.5 | 95.6 |
| Example 47 | Production Example 47 | 6.8 | 96.8 |
| Example 48 | Production Example 48 | 2.4 | 96.3 |
| Example 49 | Production Example 49 | 2.1 | 95.7 |
| Example 50 | Production Example 50 | 3.9 | 96.6 |
| Example 51 | Production Example 51 | 4.6 | 96.5 |
| Example 52 | Production Example 52 | 4.8 | 96.0 |
| Comparative Example 1 | Production Example 53 | 6.7 | 93.1 |
| Comparative Example 2 | Production Example 54 | 6.1 | 93.2 |
| Comparative Example 3 | Production Example 55 | 2.1 | 93.7 |
| Comparative Example 4 | Production Example 56 | 7.9 | 93.6 |
| Comparative Example 5 | Production Example 57 | 2.3 | 93.6 |
| Comparative Example 6 | Production Example 58 | 7.8 | 93.8 |
| Comparative Example 7 | Production Example 59 | 1.7 | 94.1 |
| Comparative Example 8 | Production Example 60 | 7.6 | 93.7 |
| Comparative Example 9 | Production Example 61 | 1.9 | 93.4 |
| Comparative Example 10 | Production Example 62 | 7.5 | 93.2 |
| Comparative Example 11 | Production Example 63 | 0.7 | 93.1 |
| Comparative Example 12 | Production Example 64 | 32.2 | 96.1 |
| Comparative Example 13 | Production Example 65 | 1.8 | 96.1 |
| Comparative Example 14 | Production Example 66 | 0.5 | 93.8 |
| Comparative Example 15 | Production Example 67 | 7.9 | 93.0 |
| Comparative Example 16 | Production Example 68 | 1.2 | 93.1 |
| Comparative Example 17 | Production Example 69 | 0.8 | 94.2 |
| Comparative Example 18 | Production Example 70 | 182.0 | 97.6 |
| Comparative Example 19 | Production Example 71 | 9.1 | 89.0 |
| Example 53 | Production Example 72 | 8.1 | 98.5 |
| Example 54 | Production Example 73 | 7.4 | 98.8 |

TABLE 3-1

|  |  | x | y | a | Mn content [parts by weight] | Auxiliary components [parts by weight] |
|---|---|---|---|---|---|---|
| Example 1 | Production Example 1 | 0.095 | 0.030 | 1.002 | 0.08 | 0.0 |
| Example 2 | Production Example 2 | 0.050 | 0.050 | 1.003 | 0.10 | 0.0 |
| Example 3 | Production Example 3 | 0.020 | 0.020 | 1.002 | 0.10 | 0.0 |
| Example 4 | Production Example 4 | 0.095 | 0.060 | 1.001 | 0.08 | 0.0 |
| Example 5 | Production Example 5 | 0.095 | 0.095 | 1.002 | 0.06 | 0.0 |
| Example 6 | Production Example 6 | 0.125 | 0.020 | 1.003 | 0.08 | 0.0 |
| Example 7 | Production Example 7 | 0.125 | 0.050 | 1.001 | 0.06 | 0.0 |
| Example 8 | Production Example 8 | 0.125 | 0.055 | 1.000 | 0.06 | 0.0 |
| Example 9 | Production Example 9 | 0.125 | 0.090 | 1.000 | 0.06 | 0.0 |
| Example 10 | Production Example 10 | 0.140 | 0.075 | 1.003 | 0.02 | 0.0 |
| Example 11 | Production Example 11 | 0.140 | 0.075 | 1.000 | 0.02 | 0.0 |
| Example 12 | Production Example 12 | 0.140 | 0.075 | 1.003 | 0.07 | 0.0 |
| Example 13 | Production Example 13 | 0.140 | 0.075 | 1.000 | 0.07 | 0.0 |
| Example 14 | Production Example 14 | 0.140 | 0.075 | 1.001 | 0.08 | 0.0 |
| Example 15 | Production Example 15 | 0.155 | 0.020 | 1.005 | 0.15 | 0.0 |
| Example 16 | Production Example 16 | 0.155 | 0.035 | 1.006 | 0.18 | 0.0 |
| Example 17 | Production Example 17 | 0.155 | 0.041 | 1.004 | 0.18 | 0.0 |
| Example 18 | Production Example 18 | 0.155 | 0.065 | 1.000 | 0.02 | 0.0 |
| Example 19 | Production Example 19 | 0.155 | 0.065 | 1.001 | 0.06 | 0.0 |
| Example 20 | Production Example 20 | 0.155 | 0.065 | 1.004 | 0.06 | 0.0 |
| Example 21 | Production Example 21 | 0.155 | 0.065 | 1.001 | 0.10 | 0.0 |
| Example 22 | Production Example 22 | 0.155 | 0.065 | 1.005 | 0.10 | 0.0 |
| Example 23 | Production Example 23 | 0.155 | 0.069 | 1.004 | 0.18 | 0.0 |
| Example 24 | Production Example 24 | 0.175 | 0.030 | 1.004 | 0.15 | 0.0 |
| Example 25 | Production Example 25 | 0.175 | 0.055 | 1.004 | 0.06 | 0.0 |
| Example 26 | Production Example 26 | 0.175 | 0.090 | 1.007 | 0.10 | 0.0 |
| Example 27 | Production Example 27 | 0.187 | 0.060 | 1.001 | 0.12 | 0.0 |
| Example 28 | Production Example 28 | 0.187 | 0.060 | 1.007 | 0.18 | 0.0 |
| Example 29 | Production Example 29 | 0.187 | 0.060 | 1.003 | 0.18 | 0.0 |
| Example 30 | Production Example 30 | 0.187 | 0.060 | 1.009 | 0.24 | 0.0 |
| Example 31 | Production Example 31 | 0.187 | 0.060 | 1.003 | 0.24 | 0.0 |
| Example 32 | Production Example 32 | 0.187 | 0.060 | 1.008 | 0.30 | 0.0 |
| Example 33 | Production Example 33 | 0.200 | 0.035 | 1.006 | 0.20 | 0.0 |
| Example 34 | Production Example 34 | 0.200 | 0.055 | 1.005 | 0.22 | 0.0 |
| Example 35 | Production Example 35 | 0.200 | 0.070 | 1.007 | 0.24 | 0.0 |
| Example 36 | Production Example 36 | 0.200 | 0.090 | 1.006 | 0.26 | 0.0 |
| Example 37 | Production Example 37 | 0.220 | 0.030 | 1.005 | 0.22 | 0.0 |
| Example 38 | Production Example 38 | 0.220 | 0.065 | 1.005 | 0.15 | 0.0 |
| Example 39 | Production Example 39 | 0.220 | 0.065 | 1.002 | 0.15 | 0.0 |
| Example 40 | Production Example 40 | 0.220 | 0.065 | 1.007 | 0.20 | 0.0 |

TABLE 3-2

|  |  | x | y | a | Mn content [parts by weight] | Auxiliary components [parts by weight] |
|---|---|---|---|---|---|---|
| Example 41 | Production Example 41 | 0.220 | 0.065 | 1.006 | 0.20 | 0.0 |
| Example 42 | Production Example 42 | 0.220 | 0.065 | 1.005 | 0.25 | 0.0 |
| Example 43 | Production Example 43 | 0.220 | 0.080 | 1.006 | 0.28 | 0.0 |
| Example 44 | Production Example 44 | 0.260 | 0.020 | 1.006 | 0.22 | 0.0 |
| Example 45 | Production Example 45 | 0.260 | 0.045 | 1.004 | 0.24 | 0.0 |
| Example 46 | Production Example 46 | 0.260 | 0.065 | 1.004 | 0.26 | 0.0 |
| Example 47 | Production Example 47 | 0.260 | 0.070 | 1.005 | 0.28 | 0.0 |
| Example 48 | Production Example 48 | 0.300 | 0.020 | 1.004 | 0.26 | 0.0 |
| Example 49 | Production Example 49 | 0.300 | 0.041 | 1.007 | 0.26 | 0.8 |
| Example 50 | Production Example 50 | 0.300 | 0.050 | 1.006 | 0.28 | 0.0 |
| Example 51 | Production Example 51 | 0.300 | 0.069 | 1.009 | 0.30 | 0.0 |
| Example 52 | Production Example 52 | 0.300 | 0.095 | 1.008 | 0.30 | 1.0 |
| Comparative Example 1 | Production Example 53 | 0.000 | 0.020 | 1.002 | 0.00 | 0.0 |
| Comparative Example 2 | Production Example 54 | 0.050 | 0.095 | 1.002 | 0.02 | 0.0 |
| Comparative Example 3 | Production Example 55 | 0.125 | 0.000 | 1.003 | 0.08 | 0.0 |
| Comparative Example 4 | Production Example 56 | 0.125 | 0.150 | 1.000 | 0.06 | 0.0 |
| Comparative Example 5 | Production Example 57 | 0.155 | 0.000 | 1.005 | 0.15 | 0.0 |
| Comparative Example 6 | Production Example 58 | 0.155 | 0.150 | 1.004 | 0.18 | 0.0 |
| Comparative Example 7 | Production Example 59 | 0.220 | 0.000 | 1.005 | 0.22 | 0.0 |
| Comparative Example 8 | Production Example 60 | 0.220 | 0.150 | 1.006 | 0.28 | 0.0 |
| Comparative Example 9 | Production Example 61 | 0.300 | 0.000 | 1.004 | 0.26 | 0.0 |
| Comparative Example 10 | Production Example 62 | 0.300 | 0.150 | 1.008 | 0.30 | 0.0 |
| Comparative Example 11 | Production Example 63 | 0.320 | 0.065 | 1.002 | 0.15 | 0.0 |

TABLE 3-2-continued

|  |  | x | y | a | Mn content [parts by weight] | Auxiliary components [parts by weight] |
|---|---|---|---|---|---|---|
| Comparative Example 12 | Production Example 64 | 0.187 | 0.060 | 0.980 | 0.18 | 0.0 |
| Comparative Example 13 | Production Example 65 | 0.220 | 0.065 | 1.005 | 0.15 | 2.1 |
| Comparative Example 14 | Production Example 66 | 0.187 | 0.060 | 1.030 | 0.18 | 0.0 |
| Comparative Example 15 | Production Example 67 | 0.140 | 0.075 | 1.003 | 0.00 | 0.0 |
| Comparative Example 16 | Production Example 68 | 0.187 | 0.060 | 1.008 | 0.45 | 0.0 |
| Comparative Example 17 | Production Example 69 | 0.220 | 0.065 | 1.005 | 0.15 | 0.0 |
| Comparative Example 18 | Production Example 70 | 0.220 | 0.065 | 1.005 | 0.15 | 0.0 |
| Comparative Example 19 | Production Example 71 | 0.220 | 0.065 | 1.005 | 0.15 | 0.0 |
| Example 53 | Production Example 72 | 0.187 | 0.060 | 1.010 | 0.40 | 0.0 |
| Example 54 | Production Example 73 | 0.160 | 0.059 | 1.009 | 0.40 | 0.0 |

Preparation of Piezoelectric Element and Evaluation of Static Characteristics

Examples 1 to 54

Piezoelectric elements of Example 1 to 54 were fabricated by using ceramics of Production Examples 1 to 52, 72, and 73.

A gold electrode having a thickness of 400 nm was formed on both sides of the disk-shaped ceramic described above by DC sputtering. A titanium film functioning as an adhesive layer and having a thickness of 30 nm was formed between the electrode and the ceramic. The ceramic with the electrodes was cut into a strip-shaped piezoelectric element 10 mm×2.5 mm×0.5 mm in size.

The piezoelectric element was placed on a hot plate having a surface adjusted to 60° C. to 100° C. and a 1 kV/mm electric field was applied to the piezoelectric element for 30 minutes to conduct a polarization treatment.

The static characteristics of the piezoelectric element, i.e., the Curie temperature, the dielectric loss, the piezoelectric constant $d_{31}$, and the mechanical quality factor (Qm), of the polarized piezoelectric element were evaluated. The results are shown in Tables 4-1 and 4-2. The mechanical quality factor is indicated in Table 6. The Curie temperature was determined from the temperature at which the dielectric constant measured under application of a 1 kHz micro AC field while varying measurement temperature was maximal. The dielectric loss was also measured simultaneously. The piezoelectric constant $d_{31}$ was determined by a resonance-anti-resonance method and the absolute value is indicated in the table.

Tables 4-1 and 4-2 also shows the amounts of Ba and Ca on a molar basis and the Ti/Zr/Mn molar ratio. In the table, "X" indicates that evaluation could not be conducted.

TABLE 4-1

|  |  | Curie temperature [° C.] | Piezoelectric constant $\|d_{31}\|$ [pC/N] | Dielectric loss [%] | (Ba + Ca)/ (Ti + Zr + Mn) |
|---|---|---|---|---|---|
| Example 1 | Production Example 1 | 120 | 104 | 0.3 | 0.999 |
| Example 2 | Production Example 2 | 115 | 134 | 0.3 | 0.999 |
| Example 3 | Production Example 3 | 124 | 125 | 0.3 | 0.998 |
| Example 4 | Production Example 4 | 110 | 115 | 0.3 | 0.998 |
| Example 5 | Production Example 5 | 85 | 130 | 0.3 | 1.000 |
| Example 6 | Production Example 6 | 125 | 92 | 0.3 | 1.000 |
| Example 7 | Production Example 7 | 114 | 100 | 0.3 | 0.999 |
| Example 8 | Production Example 8 | 112 | 104 | 0.3 | 0.998 |
| Example 9 | Production Example 9 | 88 | 120 | 0.3 | 0.998 |
| Example 10 | Production Example 10 | 100 | 106 | 0.4 | 1.002 |
| Example 11 | Production Example 11 | 100 | 111 | 0.3 | 0.999 |
| Example 12 | Production Example 12 | 100 | 100 | 0.3 | 1.000 |
| Example 13 | Production Example 13 | 100 | 107 | 0.2 | 0.997 |
| Example 14 | Production Example 14 | 100 | 100 | 0.3 | 0.998 |
| Example 15 | Production Example 15 | 123 | 95 | 0.1 | 0.999 |
| Example 16 | Production Example 16 | 118 | 77 | 0.2 | 0.999 |
| Example 17 | Production Example 17 | 117 | 82 | 0.2 | 0.997 |
| Example 18 | Production Example 18 | 107 | 111 | 0.4 | 0.999 |
| Example 19 | Production Example 19 | 106 | 100 | 0.3 | 0.999 |
| Example 20 | Production Example 20 | 106 | 91 | 0.3 | 1.002 |
| Example 21 | Production Example 21 | 106 | 90 | 0.2 | 0.997 |
| Example 22 | Production Example 22 | 106 | 84 | 0.3 | 1.001 |
| Example 23 | Production Example 23 | 102 | 88 | 0.2 | 0.997 |
| Example 24 | Production Example 24 | 121 | 91 | 0.2 | 0.998 |
| Example 25 | Production Example 25 | 112 | 84 | 0.3 | 1.002 |
| Example 26 | Production Example 26 | 88 | 116 | 0.3 | 1.003 |
| Example 27 | Production Example 27 | 106 | 85 | 0.3 | 0.996 |
| Example 28 | Production Example 28 | 106 | 79 | 0.2 | 1.000 |
| Example 29 | Production Example 29 | 106 | 85 | 0.1 | 0.996 |
| Example 30 | Production Example 30 | 106 | 77 | 0.2 | 0.999 |
| Example 31 | Production Example 31 | 106 | 81 | 0.1 | 0.993 |
| Example 32 | Production Example 32 | 106 | 75 | 0.1 | 0.996 |
| Example 33 | Production Example 33 | 118 | 67 | 0.2 | 0.998 |

TABLE 4-1-continued

|  |  | Curie temperature [° C.] | Piezoelectric constant \|d$_{31}$\|[pC/N] | Dielectric loss [%] | (Ba + Ca)/ (Ti + Zr + Mn) |
|---|---|---|---|---|---|
| Example 34 | Production Example 34 | 112 | 80 | 0.1 | 0.996 |
| Example 35 | Production Example 35 | 102 | 82 | 0.1 | 0.998 |
| Example 36 | Production Example 36 | 90 | 84 | 0.1 | 0.996 |
| Example 37 | Production Example 37 | 120 | 64 | 0.2 | 0.996 |
| Example 38 | Production Example 38 | 105 | 77 | 0.2 | 0.999 |
| Example 39 | Production Example 39 | 105 | 81 | 0.1 | 0.996 |
| Example 40 | Production Example 40 | 105 | 75 | 0.1 | 0.999 |

TABLE 4-2

|  |  | Curie temperature [° C.] | Piezoelectric constant \|d$_{31}$\|[pC/N] | Dielectric loss [%] | (Ba + Ca)/ (Ti + Zr + Mn) |
|---|---|---|---|---|---|
| Example 41 | Production Example 41 | 106 | 77 | 0.1 | 0.998 |
| Example 42 | Production Example 42 | 105 | 73 | 0.1 | 0.995 |
| Example 43 | Production Example 43 | 92 | 91 | 0.1 | 0.995 |
| Example 44 | Production Example 44 | 124 | 65 | 0.2 | 0.998 |
| Example 45 | Production Example 45 | 115 | 70 | 0.2 | 0.995 |
| Example 46 | Production Example 46 | 106 | 74 | 0.1 | 0.994 |
| Example 47 | Production Example 47 | 100 | 82 | 0.1 | 0.994 |
| Example 48 | Production Example 48 | 126 | 55 | 0.1 | 0.994 |
| Example 49 | Production Example 49 | 118 | 58 | 0.1 | 0.997 |
| Example 50 | Production Example 50 | 116 | 61 | 0.1 | 0.995 |
| Example 51 | Production Example 51 | 100 | 68 | 0.1 | 0.998 |
| Example 52 | Production Example 52 | 88 | 71 | 0.1 | 0.997 |
| Comparative Example 1 | Production Example 53 | 124 | 125 | 0.9 | 1.002 |
| Comparative Example 2 | Production Example 54 | 88 | 130 | 0.5 | 0.999 |
| Comparative Example 3 | Production Example 55 | 130 | 41 | 0.4 | 1.000 |
| Comparative Example 4 | Production Example 56 | 60 | 140 | 0.4 | 0.998 |
| Comparative Example 5 | Production Example 57 | 130 | 38 | 0.4 | 0.999 |
| Comparative Example 6 | Production Example 58 | 60 | 135 | 0.4 | 0.997 |
| Comparative Example 7 | Production Example 59 | 130 | 30 | 0.3 | 0.997 |
| Comparative Example 8 | Production Example 60 | 60 | 110 | 0.4 | 0.995 |
| Comparative Example 9 | Production Example 61 | 128 | 35 | 0.3 | 0.994 |
| Comparative Example 10 | Production Example 62 | 60 | 99 | 0.4 | 0.997 |
| Comparative Example 11 | Production Example 63 | 106 | 21 | 0.9 | 0.996 |
| Comparative Example 12 | Production Example 64 | 110 | x | x | 0.973 |
| Comparative Example 13 | Production Example 65 | 106 | 36 | 0.2 | 0.999 |
| Comparative Example 14 | Production Example 66 | 110 | 20 | 0.9 | 1.023 |
| Comparative Example 15 | Production Example 67 | 95 | 130 | 1.1 | 1.003 |
| Comparative Example 16 | Production Example 68 | 110 | 33 | 0.1 | 0.990 |
| Comparative Example 17 | Production Example 69 | 106 | 41 | 1.1 | 0.999 |
| Comparative Example 18 | Production Example 70 | 106 | x | x | 0.999 |
| Comparative Example 19 | Production Example 71 | 106 | 32 | 0.8 | 0.999 |
| Example 53 | Production Example 72 | 106 | 66 | 0.1 | 0.993 |
| Example 54 | Production Example 73 | 108 | 81 | 0.1 | 0.993 |

All samples of Examples exhibited a piezoelectric constant $d_{31}$ of 55 [pC/N] or more and a dielectric loss of 0.4% or less. Although not shown in the tables, the piezoelectric constant $d_{33}$ was also measured based on the principle of the Berlincourt method and was 110 [pC/N] or more in all samples.

Comparison was made between Examples 10 and 11, between Examples 12 and 13, between Examples 19 and 20, and between Examples 21 and 22 in which x was 0.125≤x≤0.175 and y was 0.055≤y≤0.090. Although x, y, and the Mn content were the same in all combinations, Examples 11, 13, 19, and 21 having a smaller a value exhibited superior piezoelectric constants and dielectric losses. In Examples 11, 13, 19, and 21, the ratio of the amounts of Ba and Ca to the amounts of Ti, Zr, and Mn on a molar basis was 0.996 or more and 0.999 or less.

Comparison was made between Examples 28 and 29, between Examples 30 and 31, between Examples 38 and 39, and between Examples 40 and 41 in which x was 0.155≤x≤0.300 and y was 0.041≤y≤0.069. Although x, y, and the Mn content were the same in all combinations, Examples 29, 31, 39, and 41 having a smaller a value exhibited superior piezoelectric constants and dielectric losses. In Examples 29, 31, 39, and 41, the ratio of the amounts of Ba and Ca to the amounts of Ti, Zr, and Mn on a molar basis was 0.993 or more and 0.998 or less.

Similar characteristics were observed in all Examples when the gold electrodes were replaced by electrodes prepared by baking a silver paste.

Comparative Examples 1 to 19

Piezoelectric elements of Comparative Examples 1 to 19 were fabricated by using ceramics of Production Examples 53 to 71. Fabrication and evaluation of the devices were conducted as in Examples 1 to 54.

In Comparative Examples 1 and 15, the dielectric loss was high, i.e., 0.9% to 1.1%, since Mn was not contained. In Comparative Examples 3, 5, 7, and 9, the piezoelectric constant $d_{31}$ was low, i.e., 41 [pC/N] or less, since Zr was not contained. In Comparative Examples 4, 6, 8, and 10, the Curie temperature was low, i.e., 60° C., since the Zr content was as high as 15%, and the range of temperature at which the piezoelectric element can be used was narrowed.

In Comparative Example 11, sintering did not progress sufficiently due to a high Ca content, i.e., 32% (x=0.32), and grain growth was also insufficient. Thus, the piezoelectric constant was low and the dielectric loss was high. In Comparative Example 12, the value of a was as low as 0.980 and abnormal grain growth, i.e., growth of grains larger than 30 μm, occurred and the static characteristics other than the Curie temperature could not be evaluated. The average circular equivalent diameter of crystal grains constituting a piezoelectric material used in the sample of Comparative Example 12 was significantly larger than the thickness (0.5 mm=500 μm) of the strip-shaped piezoelectric element, and thus the piezoelectric material cleaved easily and the device exhibited poor mechanical strength. In Comparative Example 13, a total of 2.1 parts by weight of Y and V were contained as the auxiliary components and thus the piezoelectric constant $d_{31}$ was as low as 36 [pC/N]. In Comparative Example 14, the value of a was as large as 1.030 and grain growth was insufficient due to insufficient sintering. Thus, the piezoelectric constant $d_{31}$ was as low as 20 [pC/N] and the dielectric loss was as high as 0.9%. In Comparative Example 16, the Mn content was as high as 0.45 parts by weight and thus the piezoelectric constant was low although the dielectric loss was low. In Comparative Example 17, the average circular equivalent diameter of grains was smaller than 1 μm, the piezoelectric constant was low, and the dielectric loss was high. In Comparative Example 18, abnormal growth of grains growing to larger than 100 μm in terms of average circular equivalent diameter of the grains was observed and thus the static characteristics other than the Curie temperature could not be evaluated due to the same reason as the sample of Comparative Example 12. In Comparative Example 19 in which the relative density was lower than 93%, the piezoelectric constant was low and the dielectric loss was high. Note that the static characteristics of Comparative Example 2 were comparable to those of samples of Examples. In Comparative Example 2, x is 0.05 and y is 0.95, which are about the same level as the samples of Examples; however, the difference from Examples is that y is greater than x.

Evaluation of Dynamic Characteristics of Piezoelectric Element

Dynamic characteristics of the piezoelectric elements were evaluated. In particular, the rate of change in piezoelectric constant when voltage was applied for 100 hours under the following conditions and the power consumption were measured.

Dynamic characteristics of Examples 8 to 14, 18 to 22, 25, and 26 and Comparative Examples 1, 4, and 19 were evaluated. The piezoelectric constant $d_{31}$ after a 110 kHz, 100 V AC voltage sufficiently far from the resonance frequency of the strip-shaped device was applied to a strip-shaped piezoelectric element for 100 hours was evaluated and the rate of change was calculated. The rate of change in piezoelectric constant between before and after the application of the voltage is summarized in Table 5.

TABLE 5

|  | Piezoelectric constant before voltage application $|d_{31}|$[pC/N] | Piezoelectric constant after voltage application $|d_{31}|$[pC/N] | Rate of change |
|---|---|---|---|
| Example 8 | 104 | 99 | −4.8% |
| Example 9 | 120 | 115 | −4.2% |
| Example 10 | 106 | 102 | −3.8% |
| Example 11 | 111 | 107 | −3.6% |
| Example 12 | 100 | 96 | −4.0% |
| Example 13 | 107 | 102 | −4.7% |
| Example 14 | 100 | 97 | −3.0% |
| Example 18 | 111 | 106 | −4.5% |
| Example 19 | 100 | 95 | −5.0% |
| Example 20 | 91 | 87 | −4.4% |
| Example 21 | 90 | 87 | −3.3% |
| Example 22 | 84 | 81 | −3.6% |
| Example 25 | 84 | 81 | −3.6% |
| Example 26 | 116 | 111 | −4.3% |
| Comparative Example 1 | 125 | 110 | −12.0% |
| Comparative Example 4 | 140 | 41 | −70.7% |
| Comparative Example 19 | 32 | 28 | −12.5% |

Whereas the rate of change in piezoelectric property was 5% or less in all samples of Examples, a rate of change of 10% or more was observed in all samples of Comparative Examples. The cause for this in Comparative Examples 1 and 19 is presumably that the dielectric loss was high and thus the electrical loss occurring under voltage application was large. Regarding Comparative Example 4, the Curie temperature was as low as 60° C. and thus depolarization presumably occurred due to heat generated from the device under voltage application. In other words, a device does not achieve sufficient operation durability unless the Curie temperature is 85° C. or more and the dielectric loss is 0.4% or less.

Another dynamic characteristic of the piezoelectric element, i.e., the power consumption, was evaluated as described below. The mechanical quality factor of Examples 17, 23, 27 to 32, 34, 38 to 42, 45, 46, and 49 to 51 and Comparative Examples 2 and 15 was evaluated by a resonance-antiresonance method. The results are shown in Table 6.

Then an AC voltage having a frequency near the resonance frequency (190 to 230 kHz) was applied to a strip-shaped piezoelectric element, and the relationship between the vibration speed and the power consumption of the device was evaluated. The vibration speed was measured with a Doppler vibrometer and the power consumption was measured with a power meter. The power consumption observed when the applied voltage and frequency were changed so that the vibration speed was 0.40 m/s is indicated in Table 6.

TABLE 6

|  | Dielectric loss [%] | Mechanical quality factor Qm | (Ba + Ca)/ (Ti + Zr + Mn) | Power consumption [mW] |
|---|---|---|---|---|
| Example 17 | 0.2 | 1050 | 0.997 | 10 |
| Example 23 | 0.2 | 1080 | 0.997 | 10 |
| Example 27 | 0.3 | 480 | 0.996 | 19 |
| Example 28 | 0.2 | 800 | 1.000 | 11 |
| Example 29 | 0.1 | 1120 | 0.996 | 9 |
| Example 30 | 0.2 | 1100 | 0.999 | 8 |
| Example 31 | 0.1 | 1400 | 0.995 | 7 |
| Example 32 | 0.1 | 1450 | 0.996 | 7 |
| Example 34 | 0.1 | 1200 | 0.996 | 9 |
| Example 38 | 0.2 | 640 | 0.999 | 16 |
| Example 39 | 0.1 | 950 | 0.996 | 10 |

TABLE 6-continued

| | Dielectric loss [%] | Mechanical quality factor Qm | (Ba + Ca)/ (Ti + Zr + Mn) | Power consumption [mW] |
|---|---|---|---|---|
| Example 40 | 0.1 | 860 | 0.999 | 13 |
| Example 41 | 0.1 | 1110 | 0.995 | 9 |
| Example 42 | 0.1 | 1280 | 0.995 | 9 |
| Example 45 | 0.2 | 1250 | 0.995 | 9 |
| Example 46 | 0.1 | 1230 | 0.994 | 9 |
| Example 49 | 0.1 | 1340 | 0.997 | 8 |
| Example 50 | 0.1 | 1370 | 0.995 | 8 |
| Example 51 | 0.1 | 1240 | 0.998 | 9 |
| Comparative Example 2 | 0.5 | 190 | 1.000 | 54 |
| Comparative Example 15 | 1.1 | 120 | 1.003 | 65 |

The power consumption of all samples of Examples was 20 mW or less whereas the power consumption of all samples of Comparative Examples was more than 50 mW. The cause for this is presumably that the mechanical quality factor of Comparative Examples 2 and 15 was as low as 190 or less. The mechanical quality factor is important when the device is driven at a frequency near the resonance frequency and is desirably 400 or more.

Preparation and Evaluation of Multilayered Piezoelectric Element

Example 55

Barium titanate having an average particle diameter of 100 nm (BT-01 produced by Sakai Chemical Industry Co., Ltd.), calcium titanate having an average particle diameter of 300 nm (CT-03 produced by Sakai Chemical Industry Co., Ltd.), and calcium zirconate having an average particle diameter of 300 nm (CZ-03 produced by Sakai Chemical Industry Co., Ltd.) were weighed so that the ratio was 84.0:10.1:5.9 on a molar basis. In order to adjust the molar ratio of Ba and Ca in A sites to Ti and Zr in B sites, 0.028 mol of barium oxalate was added. To the resulting mixture, 0.40 parts by weight of manganese(IV) oxide on a manganese metal basis and 3 parts by weight of a PVA binder were added and mixed. This mixed powder was formed into a sheet by a doctor blade method to prepare a green sheet having a thickness of 50 μm.

A conductive paste for forming internal electrodes was applied onto the green sheet by printing. The conductive paste was a Ni paste. Nine green sheets onto which the conductive paste was applied were stacked and the resulting stack was thermally press-bonded.

The thermally press-bonded stack was fired in a tubular furnace. Firing was conducted in air up to 300° C. to remove the binder, then the atmosphere was changed to a reducing atmosphere ($H_2:N_2=2:98$, oxygen concentration: $2\times10^{-6}$ Pa), and a temperature of 1380° C. was retained for 5 hours. In the cooling process, the oxygen concentration was changed to 30 Pa from 1000° C. and below and cooling was conducted to room temperature.

A sintered body obtained as such was cut into a 10 mm×2.5 mm piece. The side surfaces of the piece were polished and a pair of external electrodes (first and second electrodes) that alternately short-circuit the internal electrodes were formed on the polished side surfaces by Au sputtering. As a result, a multilayered piezoelectric element as shown in FIG. 3B was fabricated.

The internal electrodes of the multilayered piezoelectric element was observed. Layers of nickel, which is an electrode material, and the piezoelectric material layers were alternately stacked. The multilayered piezoelectric element was placed on a hot plate having a surface adjusted to 60° C. to 100° C. and an electric field of 1 kV/mm was applied to the multilayered piezoelectric element on the hot plate for 30 minutes to conduct a polarization treatment.

The piezoelectric properties of the resulting multilayered piezoelectric element were evaluated. The device had a sufficient insulating property and good piezoelectric properties comparable to that of Example 54.

Comparative Example 20

A multilayered piezoelectric element was fabricated as in Example 55. However, the composition was the same as that in Production Example 64. The piezoelectric material layers of the multilayered piezoelectric element was observed. Several crystal grains having a diameter of 20 to 30 μm were observed. Thus, the device was extremely brittle and the piezoelectric properties could not be evaluated.

Fabrication and Evaluation of Device

Liquid Discharge Head Including a Piezoelectric Element of Example 9

A liquid discharge head shown in FIG. 2 was fabricated by using a piezoelectric element of Example 9. Discharge of ink in response to input electrical signals was confirmed.

Liquid Discharge Apparatus Including a Liquid Discharge Head Including a Piezoelectric Element of Example 9

A liquid discharge apparatus shown in FIG. 6 was fabricated by using a liquid discharge head shown in FIG. 2 including a piezoelectric element of Example 9. Discharge of ink onto a recording medium in response to input electrical signals was confirmed.

Ultrasonic Motor Including a Piezoelectric Element of Example 31

An ultrasonic motor shown in FIGS. 3A and 3B was fabricated by using a piezoelectric element of Example 31.

It was confirmed that the motor was rotated in response to the AC voltage applied.

Lens Barrel Using an Ultrasonic Motor Including a Piezoelectric Element of Example 31

An optical apparatus shown in FIG. 8 was fabricated by using an ultrasonic motor that uses a piezoelectric element of Example 31. Automatic focusing operation in response to applied AC voltage was confirmed.

Electronic Apparatus Using a Piezoelectric Acoustic Component Including a Piezoelectric Element of Example 31

An electronic apparatus shown in FIG. 10 was fabricated by using a piezoelectric acoustic component including a piezoelectric element of Example 31. Operation of the speaker in accordance with an AC voltage applied was confirmed.

Liquid Discharge Head Including a Multilayered Piezoelectric Element of Example 55

A liquid discharge head shown in FIG. 2 was fabricated by using a multilayered piezoelectric element of Example 55. Discharge of ink in response to input electrical signals was confirmed.

Liquid Discharge Apparatus Using a Liquid Discharge Head Including a Multilayered Piezoelectric Element of Example 55

A liquid discharge apparatus shown in FIG. 6 was fabricated by using a liquid discharge head shown in FIG. 2 including a multilayered piezoelectric element of Example 55. Discharge of ink onto a recording medium in response to input electrical signals was confirmed.

Ultrasonic Motor Including a Multilayered Piezoelectric Element of Example 55

An ultrasonic motor shown in FIG. 3B was fabricated by using a multilayered piezoelectric element of Example 55. Rotation of a motor in response to applied AC voltage was confirmed.

Lens Barrel Using an Ultrasonic Motor Including a Multilayered Piezoelectric Element of Example 55

An optical apparatus shown in FIGS. 8A and 8B was fabricated by using a multilayered piezoelectric element of Example 55. Automatic focusing operation in response to applied AC voltage was confirmed.

Electronic Apparatus Using a Piezoelectric Acoustic Component Including a Multilayered Piezoelectric Element of Example 55

An electronic apparatus shown in FIG. 10 was fabricated by using a piezoelectric acoustic component including a multilayered piezoelectric element of Example 55. Operation of a speaker in response to applied AC voltage was confirmed.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

INDUSTRIAL APPLICABILITY

A piezoelectric element according to the invention operates stably in a wide operating temperature range, has low impact on the environment, and can be used in apparatuses, such as liquid discharge heads and ultrasonic motors, that use a large quantity of piezoelectric materials in piezoelectric elements, etc.

REFERENCE SIGNS LIST 1 first electrode
2 piezoelectric material
3 second electrode
101 piezoelectric element
102 individual liquid reservoir
103 vibrating plate
104 partition
105 discharge port
106 communicating hole
107 common reservoir
108 buffer layer
1011 first electrode
1012 piezoelectric material
1013 second electrode
201 vibrator
202 rotor
203 output shaft
204 vibrator
205 rotor
206 spring
2011 elastic ring
2012 piezoelectric element
2013 organic adhesive
2041 metal elastic member
2042 multilayered piezoelectric element
51 first electrode
53 second electrode
54 piezoelectric material layer
55 internal electrode
501 first electrode
503 second electrode
504 piezoelectric material layer
505 internal electrode
506a external electrode
506b external electrode
701 front lens group
702 rear lens (focus lens)
711 mount
712 fixed barrel
713 linear guide barrel
714 front lens group barrel
715 cam ring
716 rear lens group barrel
717 cam roller
718 shaft screw
719 roller
720 rotation transmitting ring
722 roller
724 manual focus ring
725 ultrasonic motor
726 wave washer
727 ball race
728 focus key
729 joint member
732 washer
733 low friction sheet
881 liquid discharge apparatus
882 outer casing
883 outer casing
884 outer casing
885 outer casing
887 outer casing
890 recovery unit
891 recording unit
892 carriage
896 main body
897 automatic feeding unit
898 discharge slot
899 transport unit
901 optical device
908 release button
909 strobe light unit
912 speaker
914 microphone
916 auxiliary light unit
931 main body
932 zoom lever
933 power button

The invention claimed is:

1. A piezoelectric material comprising:
a perovskite-type metal oxide containing Ba, Ca, Ti, and Zr;
a Mn;
crystal grains having an average circular equivalent diameter of 1 μm or more and 10.8 μm or less; and
a relative density of 91.8% or more and 100% or less,
wherein a molar ratio x of a content of Ca to a total of contents of Ba and Ca is in a range of $0.02 \leq x \leq 0.30$,
a molar ratio y of a content of Zr to a total of contents of Ti and Zr is in a range of $0.020 \leq y \leq 0.095$ and $y \leq x$, and
a molar ratio a of the total of contents of Ba and Ca to the total of contents of Ti and Zr is in a range of $1.00 \leq a \leq 1.01$, wherein a content of Mn relative to 100 parts by weight of the perovskite-type metal oxide is 0.02 parts by weight or more and 0.40 parts by weight or less on a metal basis, and wherein a total content of component other than the perovskite-type metal oxide and Mn relative to 100 parts by weight of the perovskite-type metal oxide is 1.2 parts by weight or less.

2. The piezoelectric material according to claim 1, wherein the perovskite-type metal oxide containing Ba, Ca, Ti, and Zr is represented by general formula (1),

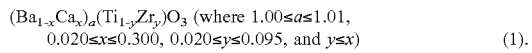
$0.020 \leq x \leq 0.300$, $0.020 \leq y \leq 0.095$, and $y \leq x$)     (1).

3. The piezoelectric material according to claim 1, wherein the crystal grains have an average circular equivalent diameter of 1 μm or more and 10 μm or less.

4. The piezoelectric material according to claim 1, wherein the density is 93% or more and 100% or less.

5. The piezoelectric material according to claim 1, wherein the ratios x and y are in respective ranges of $0.125 \leq x \leq 0.175$ and $0.055 \leq y \leq 0.09$, and the content of Mn is 0.02 parts by weight or more and 0.10 parts by weight or less relative to 100 parts by weight of the perovskite-type metal oxide, on a metal basis.

6. The piezoelectric material according to claim 1, wherein the ratios x and y are in respective ranges of $0.155 \leq x \leq 0.300$ and $0.041 \leq y \leq 0.069$, and the content of Mn is 0.12 parts by weight or more and 0.40 parts by weight or less relative to 100 parts by weight of the perovskite-type metal oxide, on a metal basis.

7. The piezoelectric material according to claim 1, comprising a total content of Li, Na, Mg, and Al that is 0.5 parts by weight or less on a metal basis relative to 100 parts by weight of the perovskite-type metal oxide.

8. A piezoelectric material comprising:
a perovskite-type metal oxide containing Ba, Ca, Ti, and Zr; and
a Mn;
wherein a molar ratio x of a content of Ca to a total of contents of Ba and Ca is in a range of $0.02 \leq x \leq 0.30$,
a molar ratio y of a content of Zr to a total of contents of Ti and Zr is in a range of $0.020 \leq y \leq 0.095$ and $y \leq x$, and
wherein a content of Mn relative to 100 parts by weight of the perovskite-type metal oxide is 0.02 parts by weight or more and 0.40 parts by weight or less on a metal basis.

9. The piezoelectric material according to claim 8, further comprising:
a relative density of 91.8% or more and 100% or less.

10. The piezoelectric material according to claim 9, wherein the relative density is 91.8% or more and 98.7% or less.

11. The piezoelectric material according to claim 8, further comprising:
crystal grains having an average circular equivalent diameter of 1 μm or more and 10.8 μm or less.

12. A piezoelectric element comprising:
an electrode; and
a piezoelectric material according to claim 8.

13. The piezoelectric element according to claim 12, wherein the piezoelectric material and the electrode are alternately stacked.

14. An electronic apparatus comprising the piezoelectric element according to claim 12.

15. A liquid discharge head comprising:
a liquid reservoir including a vibrating unit that includes the piezoelectric element according to claim 12; and
a discharge port in communication with the liquid reservoir.

16. A liquid discharge apparatus comprising:
a stage on which a target is placed; and
the liquid discharge head according to claim 15.

17. An ultrasonic motor comprising:
a vibrating member including a piezoelectric element according to claim 12; and
a moving member in contact with the vibrating member.

18. An optical apparatus comprising a driving unit including the ultrasonic motor according to claim 17.

19. A piezoelectric acoustic component comprising the piezoelectric element according to claim 12.

20. The piezoelectric material according to claim 8, wherein a piezoelectric constant d33 of the piezoelectric material is 110pC/N or more.

21. A piezoelectric material comprising:
a perovskite-type metal oxide containing Ba, Ca, Ti, and Zr;
a Mn;
wherein a molar ratio x of a content of Ca to a total content of Ba and Ca is in a range of $0.02 \leq x \leq 0.30$, and
a molar ratio y of a content of Zr to a total content of Ti and Zr is in a range of $0.020 \leq y \leq 0.095$ and $y \leq x$,
wherein a content of Mn is 0.02 parts by weight or more and 0.40 parts by weight or less on a metal basis relative to 100 parts by weight of the perovskite-type metal oxide,
wherein a relative density of the piezoelectric material is 91.8% or more and 100% or less, and
wherein a piezoelectric constant d33 of the piezoelectric material is 110pC/N or more.

22. The piezoelectric material according to claim 21, wherein the perovskite-type metal oxide containing Ba, Ca, Ti, and Zr is represented by general formula (1),
$(Ba_{i-x}Ca_x)_a(Ti_{i-y}Zr_y)O_3$ (where 1.00≤a≤1.01, 0.020≤x≤0.300, 0.020≤y≤0.095, and y≤x) (1).

23. The piezoelectric material according to claim 21, wherein the relative density of the piezoelectric material is 91.8% or more and 98.7% or less.

24. The piezoelectric material according to claim 21, wherein an average circular equivalent diameter of crystal grains of the piezoelectric material is 1μm or more and 10.8μm or less.

25. The piezoelectric material according to claim 21, wherein the molar ratios x and y are in respective ranges of $0.125 \leq x \leq 0.175$ and $0.055 \leq y \leq 0.09$.

26. The piezoelectric material according to claim 25, wherein the content of Mn is 0.02 parts by weight or more and 0.10 parts by weight or less on the metal basis relative to 100 parts by weight of the perovskite-type metal oxide.

27. The piezoelectric material according to claim 21, wherein the ratios x and y are in respective ranges of $0.155 \leq x \leq 0.300$ and $0.041 \leq y \leq 0.069$.

28. The piezoelectric material according to claim 27, wherein the content of Mn is 0.12 parts by weight or more and 0.40 parts by weight or less on the metal basis relative to 100 parts by weight of the perovskite-type metal oxide.

29. The piezoelectric material according to claim 21, wherein a total content of Li, Na, Mg, and Al is 0.5 parts by weight or less on a metal basis relative to 100 parts by weight of the perovskite-type metal oxide.

30. A piezoelectric element comprising:
an electrode; and
the piezoelectric material according to claim 21.

31. The piezoelectric element according to claim 30, wherein the piezoelectric material and the electrode are alternately stacked.

32. A liquid discharge head comprising:
a liquid reservoir including a vibrating unit that includes the piezoelectric element according to claim 30; and
a discharge port in communication with the liquid reservoir.

33. A liquid discharge apparatus comprising:
a stage on which a target is placed; and
the liquid discharge head according to claim 32.

34. An ultrasonic motor comprising:
a vibrating member including the piezoelectric element according to claim 30; and
a moving member in contact with the vibrating member.

35. An optical apparatus comprising a driving unit including the ultrasonic motor according to claim 34.

36. A piezoelectric acoustic component comprising the piezoelectric element according to claim 30.

37. An electronic apparatus comprising the piezoelectric element according to claim 30.

* * * * *

UNITED STATES PATENT AND TRADEMARK OFFICE
CERTIFICATE OF CORRECTION

| | |
|---|---|
| PATENT NO. | : 10,424,721 B2 |
| APPLICATION NO. | : 15/098169 |
| DATED | : September 24, 2019 |
| INVENTOR(S) | : Jumpei Hayashi et al. |

It is certified that error appears in the above-identified patent and that said Letters Patent is hereby corrected as shown below:

On the Title Page

Item (72), in "Inventors", add:
Hiroshi Saito, Kanagawa (JP)

Signed and Sealed this
Sixteenth Day of May, 2023

Katherine Kelly Vidal
*Director of the United States Patent and Trademark Office*